US009698210B2

(12) United States Patent
Cho et al.

(10) Patent No.: US 9,698,210 B2
(45) Date of Patent: Jul. 4, 2017

(54) DISPLAY DEVICE AND METHOD OF MANUFACTURING THE SAME

(71) Applicant: Samsung Display Co., Ltd., Yongin, Gyeonggi-do (KR)

(72) Inventors: Seunghwan Cho, Yongin (KR); Dohyun Kwon, Yongin (KR); Taehyun Kim, Yongin (KR); Donghwan Shim, Yongin (KR); Sungeun Lee, Yongin (KR); Iljeong Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 6 days.

(21) Appl. No.: 14/684,200

(22) Filed: Apr. 10, 2015

(65) Prior Publication Data
US 2016/0133684 A1    May 12, 2016

(30) Foreign Application Priority Data

Nov. 7, 2014    (KR) .......................... 10-2014-0154731

(51) Int. Cl.
| | |
|---|---|
| *H01L 27/32* | (2006.01) |
| *G02F 1/1362* | (2006.01) |
| *H01L 27/12* | (2006.01) |

(52) U.S. Cl.
CPC ........ *H01L 27/3279* (2013.01); *H01L 27/124* (2013.01); *H01L 27/3262* (2013.01); *H01L 27/3265* (2013.01); *G02F 2001/13629* (2013.01)

(58) Field of Classification Search
CPC ............... H01L 27/124; H01L 27/3279; G02F 2001/13629
See application file for complete search history.

(56) References Cited

U.S. PATENT DOCUMENTS

| | | |
|---|---|---|
| 2007/0096636 A1 | 5/2007 | Park et al. |
| 2007/0166859 A1 | 7/2007 | Lee et al. |
| 2012/0001156 A1* | 1/2012 | Cho .................... H01L 27/1248 257/40 |
| 2012/0001885 A1 | 1/2012 | Kang et al. |
| 2012/0009691 A1 | 1/2012 | Chung |

(Continued)

FOREIGN PATENT DOCUMENTS

| | | |
|---|---|---|
| KR | 10-2007-0045690 A | 5/2007 |
| KR | 10-2007-0070382 A | 7/2007 |

(Continued)

*Primary Examiner* — Daniel Luke
(74) *Attorney, Agent, or Firm* — Knobbe Martens Olson & Bear LLP

(57) ABSTRACT

A display device and method of manufacturing the same are disclosed. In one aspect, the display device includes a first line extending in a first direction, a second line extending in a second direction, and a storage capacitor electrically connected to at least one of the first line and the second line. The first line includes a first metal pattern layer extending in the first direction, an intermediate insulating layer formed over the first metal pattern layer, and a second metal pattern layer formed over the first metal pattern layer and the intermediate insulating layer. The second metal pattern layer extends in the first direction. The first line also includes a third metal pattern layer electrically connecting the first metal pattern layer to the second metal pattern layer via a contact hole.

26 Claims, 21 Drawing Sheets

(56) References Cited

U.S. PATENT DOCUMENTS

| | | | |
|---|---|---|---|
| 2013/0181217 A1* | 7/2013 | Hara | H01L 27/1225 257/43 |
| 2013/0214278 A1* | 8/2013 | Nam | H01L 27/1214 257/59 |
| 2014/0034923 A1 | 2/2014 | Kim et al. | |
| 2014/0042395 A1 | 2/2014 | Shim et al. | |

FOREIGN PATENT DOCUMENTS

| KR | 10-2012-0003536 A | 1/2012 |
|---|---|---|
| KR | 10-2013-0110987 A | 10/2013 |
| KR | 10-2014-0018623 A | 2/2014 |
| KR | 10-2014-0022523 A | 2/2014 |

\* cited by examiner

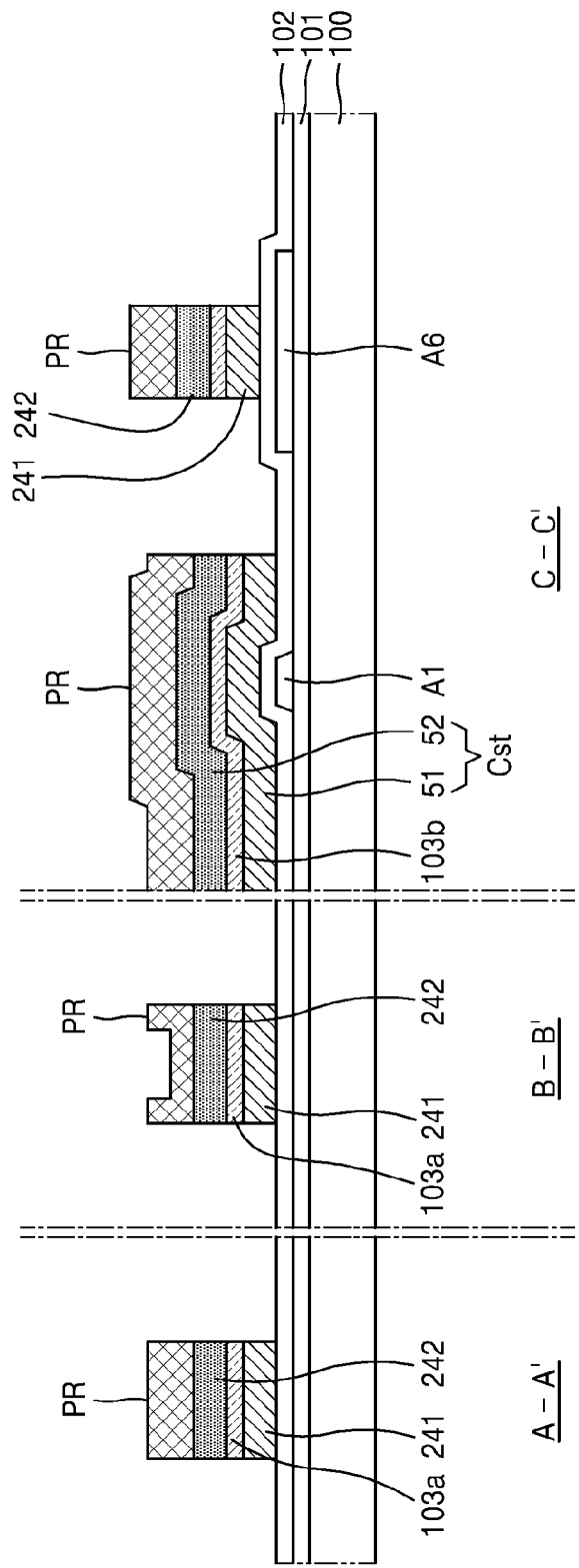

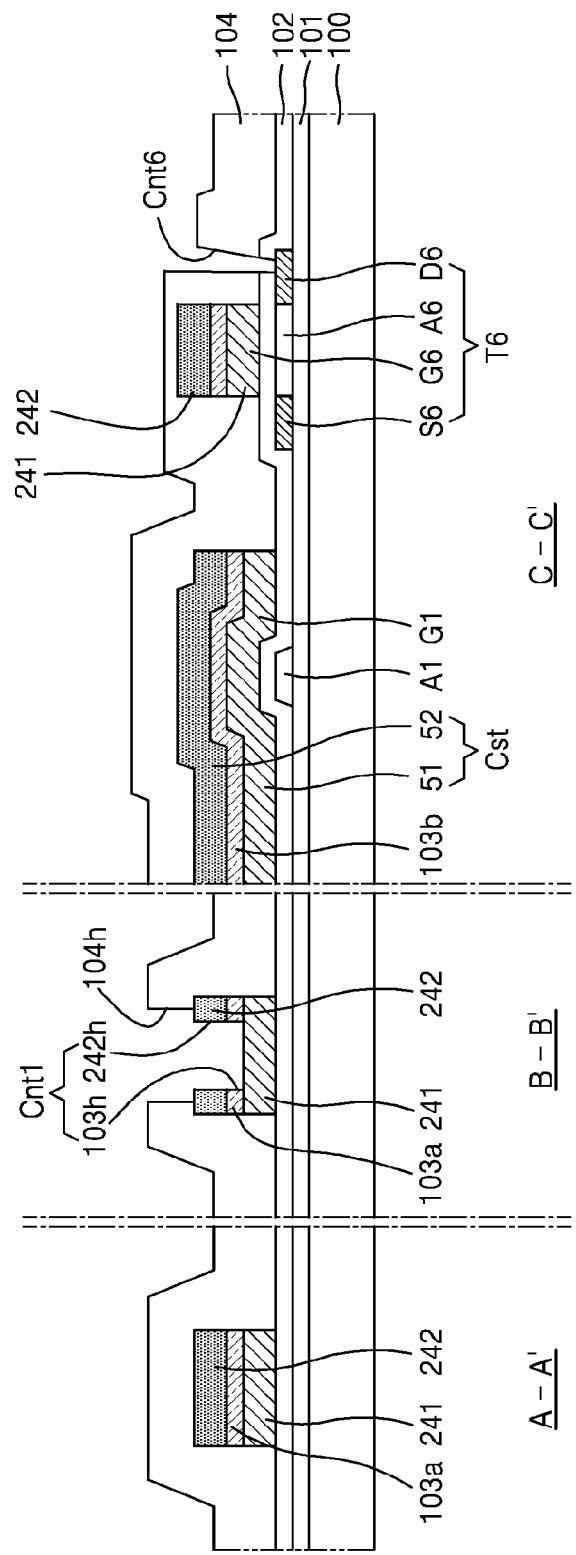

DISPLAY DEVICE AND METHOD OF MANUFACTURING THE SAME

INCORPORATION BY REFERENCE TO ANY PRIORITY APPLICATIONS

This application claims the benefit of Korean Patent Application No. 10-2014-0154731, filed on Nov. 7, 2014, in the Korean Intellectual Property Office, the disclosure of which is incorporated herein in its entirety by reference.

BACKGROUND

Field

The described technology generally relates to a display device and a method of manufacturing the display device.

Description of the Related Technology

Recently, display devices, or panels, have been used for various purposes. Also, displays have recently been manufactured to have thin profiles and to be lightweight, increasing the number of their applications.

As the demand for higher resolution displays increases, the signal lines which apply gate driving signals or data driving signals are required to be thinner and longer. As the width of the signal lines decreases and their length increases, the resistance increases which leads to resistive-capacitive (RC) delay.

SUMMARY OF CERTAIN INVENTIVE ASPECTS

One inventive aspect is a display device and a method of manufacturing the display device.

Additional aspects will be set forth in part in the description which follows and, in part, will be apparent from the description, or may be learned by practice of the presented embodiments.

Another aspect is a display device including a first line extending in a first direction; a second line extending in a second direction; and a storage capacitor electrically connected to at least one of the first line and the second line, wherein the first line includes: a first metal pattern layer extending in the first direction; a second metal pattern layer formed on the first metal pattern layer while an intermediate insulating layer is formed between the first metal pattern layer and the second metal pattern layer, the second metal pattern layer extending in the first direction; and a third metal pattern layer connecting the first metal pattern layer and the second metal pattern layer to each other through a contact hole.

The second metal pattern layer may have substantially a same pattern as the first metal pattern layer.

The intermediate insulating layer may have substantially a same pattern as the first metal pattern layer and the second metal pattern layer.

The third metal pattern layer may be located on the second metal pattern layer.

The third metal pattern layer may be located at a same layer as the second line and include a material that is the same as a material included in the second line.

The display device may further include an insulating layer covering the first line and the storage capacitor, wherein the insulating layer may include a through hole corresponding to the contact hole.

An inner diameter of the through hole may be equal to or greater than an outer diameter of the contact hole.

The contact hole may expose an upper surface of the first metal pattern layer.

The third metal pattern layer may contact at least a part of an upper surface of the first metal pattern layer and an upper surface of the second metal pattern layer.

The storage capacitor may include a first electrode, a second electrode located on the first electrode, and a dielectric layer formed between the first electrode and the second electrode, and the first electrode, the dielectric layer, and the second electrode may be respectively located on same layers as the first metal pattern layer, the intermediate insulating layer, and the second metal pattern layer and may include materials that are the same as materials included in the first metal pattern layer, the intermediate insulating layer, and the second metal pattern layer.

The first line may include at least one of a scan line and an emission control line and the second line may include a data line.

The third metal pattern layer may be an island type.

Another aspect is a method of manufacturing a display device, the method including forming a first line extending in a first direction; forming a second line extending in a second direction; and forming a storage capacitor comprising a first electrode, a dielectric layer, and a second electrode, wherein the forming of the first line includes: forming a first metal pattern layer extending in the first direction; forming an intermediate insulating layer on the first metal pattern layer; forming a second metal pattern layer extending in the first direction on the intermediate insulating layer; and forming a third metal pattern layer that connects the first metal pattern layer and the second metal pattern layer to each other via a contact hole.

In the forming of the second metal pattern layer, the second metal pattern layer may have substantially the same pattern as the first metal pattern layer.

In the forming of the third metal pattern layer, the third metal pattern layer may contact a part of an upper surface of the first metal pattern layer and an upper surface of the second metal pattern layer.

The method may further include: forming an insulating layer covering the second metal pattern layer; and forming a through hole that penetrates through the insulating layer and corresponds to the contact hole, wherein forming of the insulating layer and forming of the through hole are performed before the forming of the third metal pattern layer.

In the forming of the second metal pattern layer, the second metal pattern layer may include a first hole, the forming of the through hole may include forming a second hole that corresponds to the first hole and the intermediate insulating layer, and the first hole and the second hole may form the contact hole.

An inner diameter of the through hole may be equal to or greater than an outer diameter of the first contact hole.

The third metal pattern layer may be located at a same layer as the second line and may include a material that is the same as a material included in the second line.

The first metal pattern layer may be located at the same layer as the first electrode and may include a material that is the same as the material included in the first electrode, and the second metal pattern layer may be located at the same layer as the second electrode and may include a material that is the same as the material included in the second electrode.

The third metal pattern layer may be an island type.

The first line may include at least one of a scan line and an emission control line and the second line may include a data line.

The forming of the first metal pattern layer, the forming of the intermediate insulating layer, and the forming of the second metal pattern layer may be performed at the same time in a mask process.

Another aspect is a display device comprising a first line extending in a first direction; a second line extending in a second direction; and a storage capacitor electrically connected to at least one of the first line and the second line, wherein the first line includes: a first metal pattern layer extending in the first direction; an intermediate insulating layer formed over the first metal pattern layer; a second metal pattern layer formed over the first metal pattern layer and the intermediate insulating layer, the second metal pattern layer extending in the first direction; and a third metal pattern layer electrically connecting the first metal pattern layer to the second metal pattern layer via a contact hole.

In exemplary embodiments, the second metal pattern layer has substantially the same pattern as the first metal pattern layer. The intermediate insulating layer can have substantially the same pattern as the first and second metal pattern layers. The third metal pattern layer can be formed directly on the second metal pattern layer. The third metal pattern layer can be formed on the same layer as the second line and is formed of the same material as the second line. The contact hole can penetrate through the intermediate insulating layer and the second metal pattern layer. The contact hole can expose an upper surface of the first metal pattern layer.

In exemplary embodiments, the display device further comprises an insulating layer covering the first line and the storage capacitor, wherein the insulating layer comprises a through hole corresponding to the contact hole. An inner diameter of the through hole can be equal to or greater than an outer diameter of the contact hole. An upper surface of the first metal pattern layer and an upper surface of the second metal pattern layer can be exposed via the through hole. The third metal pattern layer can contact at least a portion of an upper surface of the first metal pattern layer and an upper surface of the second metal pattern layer.

In exemplary embodiments, the storage capacitor comprises a first electrode, a second electrode formed over the first electrode, and a dielectric layer interposed between the first electrode and the second electrode and wherein the first electrode, the dielectric layer, and the second electrode are respectively formed on the same layers as the first metal pattern layer, the intermediate insulating layer, and the second metal pattern layer and comprise the same materials as that of the first metal pattern layer, the intermediate insulating layer, and the second metal pattern layer. The first line can comprise at least one of a scan line and an emission control line and the second line comprises a data line. The third metal pattern layer can be an island type layer.

Another aspect is a method of manufacturing a display device, comprising forming a first line extending in a first direction; forming a second line extending in a second direction; and forming a storage capacitor comprising a first electrode, a dielectric layer, and a second electrode, wherein the forming of the first line comprises: forming a first metal pattern layer extending in the first direction; forming an intermediate insulating layer over the first metal pattern layer; forming a second metal pattern layer extending in the first direction over the intermediate insulating layer; and forming a third metal pattern layer that connects the first metal pattern layer to the second metal pattern layer via a contact hole.

In exemplary embodiments, the second metal pattern layer has substantially the same pattern as the first metal pattern layer. The forming of the third metal pattern layer can comprise forming the third metal pattern layer so as to contact a portion of an upper surface of the first metal pattern layer and an upper surface of the second metal pattern layer. The method can further comprise forming the contact hole so as to penetrate through the intermediate insulating layer and the second metal pattern layer. The method can further comprise forming an insulating layer that covers the second metal pattern layer; and forming a through hole that penetrates through the insulating layer and is aligned with the contact hole, wherein the forming of the insulating layer and the forming of the through hole are performed before the forming of the third metal pattern layer.

In exemplary embodiments, the forming of the second metal pattern layer comprises forming a first hole in the second metal pattern layer, and the forming of the through hole comprises forming a second hole in the insulating layer that is aligned with the first hole, the first hole and the second hole forming the contact hole. An inner diameter of the through hole can be equal to or greater than an outer diameter of the contact hole. The third metal pattern layer can be formed on the same layer as the second line and comprises the same material as that of the second line. The first metal pattern layer can be formed on the same layer as the first electrode and comprises the same material as that of the first electrode and wherein the second metal pattern layer is formed on the same layer as the second electrode and comprises the same material as that of the second electrode.

In exemplary embodiments, the third metal pattern layer is an island type layer. The first line can comprise at least one of a scan line and an emission control line and the second line can comprise a data line. The forming of the first metal pattern layer, the forming of the intermediate insulating layer, and the forming of the second metal pattern layer can be performed at the same time in a mask process.

BRIEF DESCRIPTION OF THE DRAWINGS

These and/or other aspects will become apparent and more readily appreciated from the following description of the exemplary embodiments, taken in conjunction with the accompanying drawings in which:

FIGS. 7A through 7H are cross-sectional views illustrating a method of manufacturing the display device according to another embodiment.

DETAILED DESCRIPTION OF CERTAIN INVENTIVE EMBODIMENTS

Figure 1:
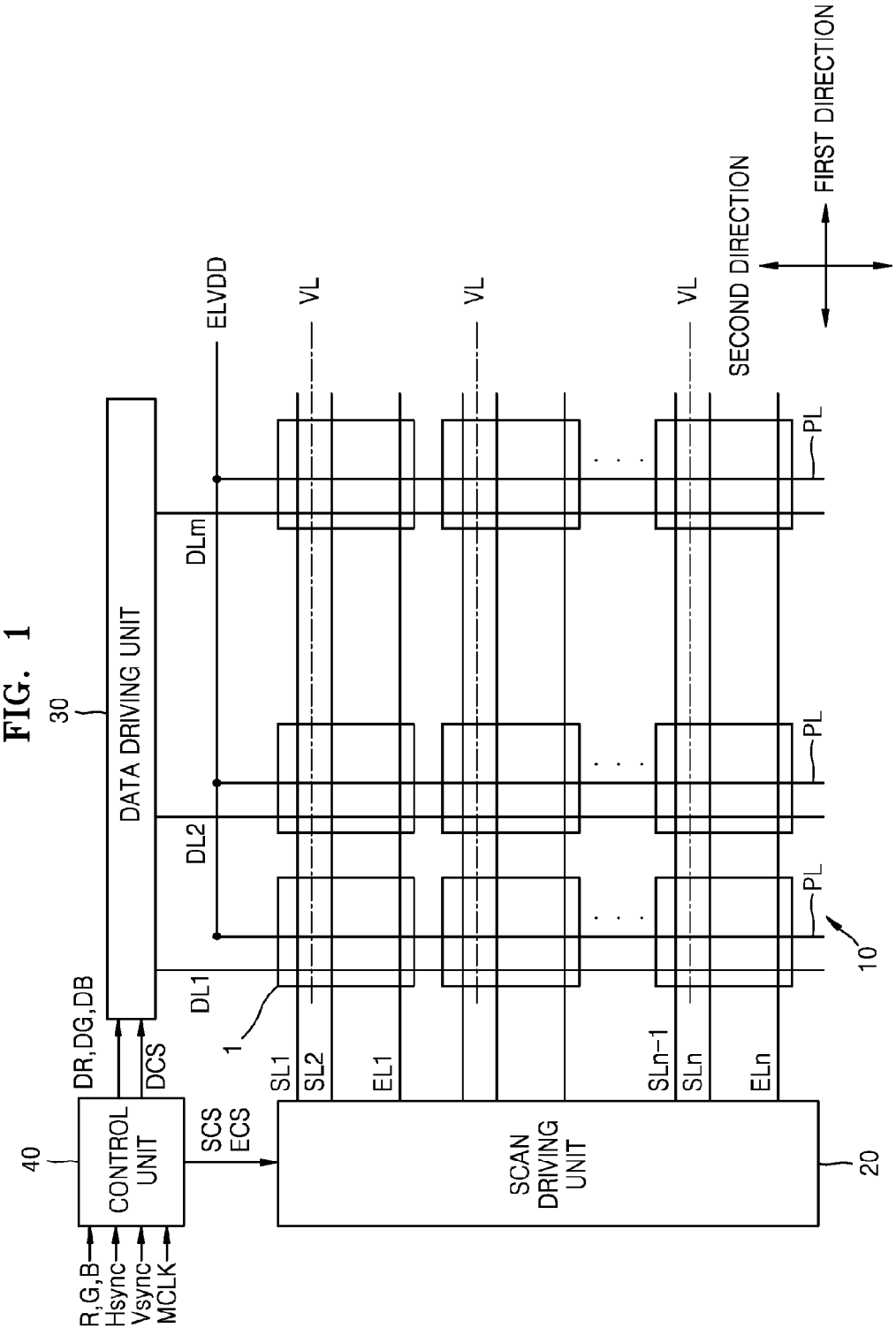
FIG. 1 is a schematic block diagram of a display device according to an embodiment.

As the described technology allows for various changes and numerous embodiments, particular embodiments will be illustrated in the drawings and described in detail in the written description. However, this is not intended to limit the described technology to particular modes of practice and it is to be appreciated that all changes, equivalents, and substitutes that do not depart from the spirit and technical scope are encompassed in the described technology. In the description, certain detailed explanations of the related art are omitted when it is deemed that they may unnecessarily obscure the essence of the described technology.

The described technology will now be described more fully with reference to the accompanying drawings, in which exemplary embodiments are shown. Like reference numerals in the drawings denote like elements, and thus redundant description thereof will be omitted.

While such terms as "first," "second," etc., may be used to describe various components, such components must not be limited to the above terms. The above terms are used only to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of the stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may also be present.

Sizes of components in the drawings may be exaggerated for the sake of clarity. In other words, since the sizes and thicknesses of components in the drawings may be exaggerated, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "formed on" another layer, region, or component, it can be directly or indirectly formed on the other layer, region, or component. That is, for example, intervening layers, regions, or components may also be present. As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic block diagram of a display device according to an embodiment.

The display device according to the present embodiment includes a display unit or display panel 10 including a plurality of pixels 1, a scan driving unit or scan driver 20, a data driving unit or data driver 30, and a control unit or controller 40.

The display unit 10 includes the pixels 1 arranged as a matrix. The pixels 1 may be located at the intersections between a plurality of scan lines SL1 through SLn, a plurality of data lines DL1 through DLm, and a plurality of emission control lines EL1 through ELn. The scan lines SL1 through SLn and the emission control lines EL1 through ELn extend in a first direction that is a row direction and the data lines DL1 through DLm and a plurality of driving voltage lines PL extend in a second direction that is a column direction. In one line of pixels, a value of n for the scan lines SL1 through SLn may be different from that of the emission control lines EL1 through ELn.

Each of the pixels 1 is connected to two scan lines from among the scan lines SL1 through SLn transmitted to the display unit 10. In FIG. 1, each pixel 1 is connected to a scan line corresponding to a current pixel line and a scan line corresponding to a previous pixel line, but is not limited thereto.

Each of the pixels 1 is connected to one of the data lines DL1 through DLm and one of the emission control lines EL1 through ELn. In addition, each pixel 1 is connected to one of a plurality of initialization voltage lines VL that supplies an initialization voltage and one of a plurality of driving voltage lines PL that supplies a first power voltage ELVDD. Although not shown in FIG. 1, two adjacent pixels 1 from among the pixels 1 can share an initialization voltage line VL.

The scan driving unit 20 generates two scan signals and transfers the scan signals to each of the pixels 1 through the scan lines SL1 through SLn. That is, the scan driving unit 20 transfers a first scan signal through a scan line corresponding to the row in which the corresponding pixel 1 is included and transfers a second scan signal through a scan line corresponding to a previous row. For example, the scan driving unit 20 can transfer a first scan signal Sn to a pixel 1 arranged at n-th row and m-th column through an n-th scan line SLn and can transfer a second scan signal Sn−1 to the pixel 1 through an (n−1)-th scan line SLn−1. Also, the scan driving unit 20 can generate and transfer an emission control signal to each pixel 1 via the emission control lines EL1 through ELn.

In the embodiment of FIG. 1, the scan signals and the emission control signals are generated by the scan driving unit 20, but are not limited thereto. In another embodiment, a display device can further an emission control driving unit or emission driver (not shown) and the emission control driving unit can generate emission control signals.

The data driving unit 30 can transfer data signals to each of the pixels 1 through the data lines DL1 through DLm.

The control unit 40 converts a plurality of image signals R, G, and B received from an external source into a plurality of image data signals DR, DG, and DB, and then, transfers the image data signals DR, DG, and DB to the data driving unit 30. Also, the control unit 40 receives a vertical synchronization signal Vsync, a horizontal synchronization signal Hsync, and a clock signal MCLK to generate control signals for controlling the driving of the scan driving unit 20 and the data driving unit 30, and transfers the control signals to the scan driving unit 20 and the data driving unit 30. That is, the control unit 40 generates a scan driving control signal SCS and an emission control signal ECS for controlling the scan driving unit 20, and a data driving control signal DCS for controlling the data driving unit 30, and transfers the control signals to the corresponding units.

Each of the pixels 1 receives the first power voltage ELVDD and a second power voltage ELVSS (refer to FIG. 2) from a component external to the display unit 10. The first power voltage ELVDD can be a voltage having a high voltage level and the second power voltage ELVSS can be a voltage having a lower level than the first power voltage ELVDD or a ground voltage.

Each pixel 1 emits light having a predetermined luminance by using a driving current (Id, refer to FIG. 2) supplied to an organic light-emitting diode (OLED) according to the data signals D1 through Dm transmitted through the data lines DL1 through DLm.

Figure 2:
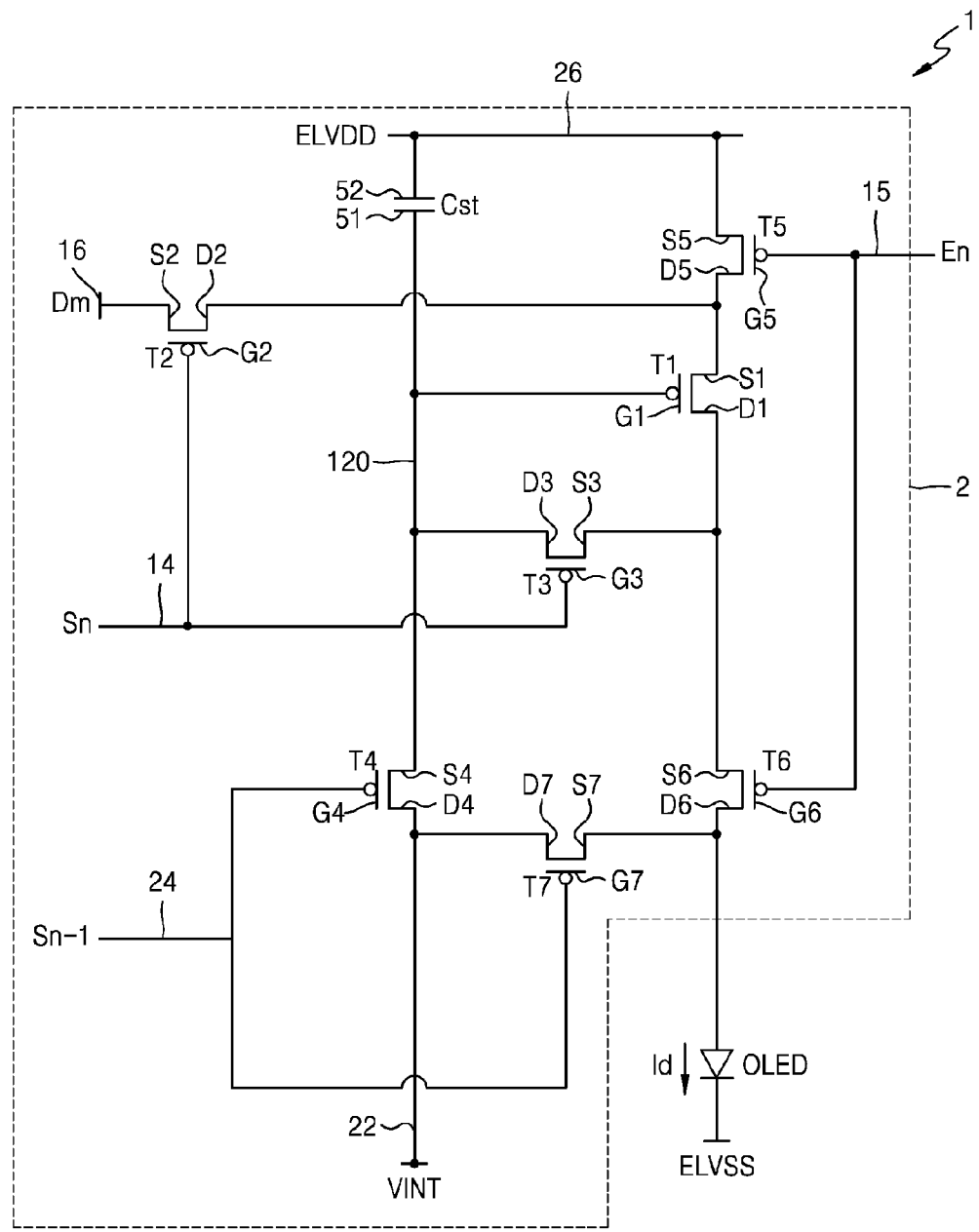
FIG. 2 is an equivalent circuit diagram of a pixel of the display device of FIG. 1.

FIG. 2 is an equivalent circuit diagram of a pixel 1 in an OLED display according to an embodiment.

The pixel 1 includes a pixel circuit 2 including a plurality of thin film transistors (TFTs) T1 through T7 and a storage capacitor Cst. In addition, the pixel 1 includes an OLED that receives a driving voltage Id through the pixel circuit 2 to emit light.

The TFTs include a driving TFT T1, and a plurality of switching TFTs including a data transmission TFT T2, a compensation TFT T3, a first initializing TFT T4, a first emission control TFT T5, a second emission control TFT T6, and a second initializing TFT T7.

The pixel 1 includes a first scan line 14 transmitting a first scan signal Sn to the data transmission TFT T2 and the compensation TFT T3, a second scan line 24 transmitting a second scan signal Sn−1 to the first and second initializing TFTs T4 and T7, and an emission control line 15 transmitting an emission control signal En to the first and second emission control TFTs T5 and T6. The pixel 1 further includes a data line 16 transmitting a data signal Dm, a driving voltage line 26 supplying the first power voltage ELVDD, and an initialization voltage line 22 transmitting an initialization voltage VINT for initializing the driving TFT T1.

A driving gate electrode G1 of the driving TFT T1 is connected to a first electrode 51 of the storage capacitor Cst. A driving source electrode S1 of the driving TFT T1 is connected to the driving voltage line 26 via the first emission control TFT T5. A driving drain electrode D1 of the driving TFT T1 is electrically connected to a pixel (anode) electrode of the OLED via the second emission control TFT T6. The driving TFT T1 supplies a driving current Id to the OLED after receiving the data signal Dm according to the switching operation of the data transmission TFT T2.

A data transmission gate electrode G2 of the data transmission TFT T2 is connected to the first scan line 14. A data transmission source electrode S2 of the data transmission TFT T2 is connected to the data line 16. A data transmission drain electrode D2 of the data transmission TFT T2 is connected to the driving source electrode S1 of the driving TFT T1, and at the same time, is connected to the driving voltage line 26 via the first emission control TFT T5. The data transmission TFT T2 is turned on according to the first scan signal Sn transmitted through the first scan line 14 and performs a switching operation for transmitting the data signal Dm transmitted through the data line 16 to the driving source electrode S1 of the driving TFT T1.

A compensation gate electrode G3 of the compensation TFT T3 is connected to the first scan line 14. A compensation source electrode S3 of the compensation TFT T3 is connected to the driving drain electrode D1 of the driving TFT T1, and at the same time, is connected to the anode electrode of the OLED via the second emission control TFT T6. The compensation drain electrode D3 of the compensation TFT T3 is connected to a first electrode 51 of the storage capacitor Cst, a first initializing source electrode S4 of the first initialization TFT T4, and the driving gate electrode G1 of the driving TFT T1. The compensation TFT T3 is turned on according to the first scan signal Sn transmitted through the first scan line 14 to connect the driving gate electrode G1 and the driving drain electrode D1 of the driving TFT T1 to each other for diode-connection of the driving TFT T1.

A first initialization gate electrode G4 of the first initialization TFT T4 is connected to the second scan line 24. A first initialization drain electrode D4 of the first initialization TFT T4 is connected to the initialization voltage line 22. A first initialization source electrode S4 of the first initialization TFT T4 is connected to the first electrode 51 of the storage capacitor Cst, the compensation drain electrode D3 of the compensation TFT T3, and the driving gate electrode G1 of the driving TFT T1. The first initialization TFT T4 is turned on according to the second scan signal Sn−1 transmitted through the second scan line 24 to perform an initialization operation, that is, initialize a voltage at the driving gate electrode G1 of the driving TFT T1 by transmitting the initialization voltage VINT to the driving gate electrode G1 of the driving TFT T1.

A first emission control gate electrode G5 of the first emission control TFT T5 is connected to the emission control line 15. A first emission control source electrode S5 of the first emission control TFT T5 is connected to the driving voltage line 26. A first emission control drain electrode D5 of the first emission control TFT T5 is connected to the driving source electrode S1 of the driving TFT T1 and the data transmission drain electrode D2 of the data transmission TFT T2.

A second emission control gate electrode G6 of the second emission control TFT T6 is connected to the emission control line 15. A second emission control source electrode S6 of the second emission control TFT T6 is connected to the driving drain electrode D1 of the driving TFT T1 and the compensation source electrode S3 of the compensation TFT T3. A second emission control drain electrode D6 of the second emission control TFT T6 is electrically connected to the anode electrode of the OLED. The first emission control TFT T5 and the second emission control TFT T6 are simultaneously turned on according to the emission control signal En transmitted through the emission control line 15 so that the first power voltage ELVDD is transmitted to the OLED and the driving current Id flows through the OLED.

A second initialization gate electrode G7 of the second initialization TFT T7 is connected to the second scan line 24. A second initialization source electrode S7 of the second initialization TFT T7 is connected to the anode electrode of the OLED. A second initialization drain electrode D7 of the second initialization TFT T7 is connected to the initialization voltage line 22. The second initialization TFT T7 is turned on according to the second scan signal Sn−1 transmitted through the second scan line 24 to initialize the anode electrode of the OLED.

In the present embodiment, the first initialization TFT T4 and the second initialization TFT T7 are connected to the second scan line 24, but are not limited thereto. As another embodiment, the first initialization TFT T4 can be connected to the second scan line 24 and driven according to the second scan signal Sn−1 and the second initialization TFT T7 can be connected to an additional third scan line (not shown) to operate according to another third scan signal Sn+1.

A second electrode 52 of the storage capacitor Cst is connected to the driving voltage line 26. The first electrode 51 of the storage capacitor Cst is connected to the driving gate electrode G1 of the driving TFT T1, the compensation drain electrode D3 of the compensation TFT T3, and the first initialization source electrode S4 of the first initialization TFT T4.

A cathode electrode of the OLED is connected to the second power voltage ELVSS. The OLED receives the driving current Id from the driving TFT T1 to emit light and display images.

Figure 3:
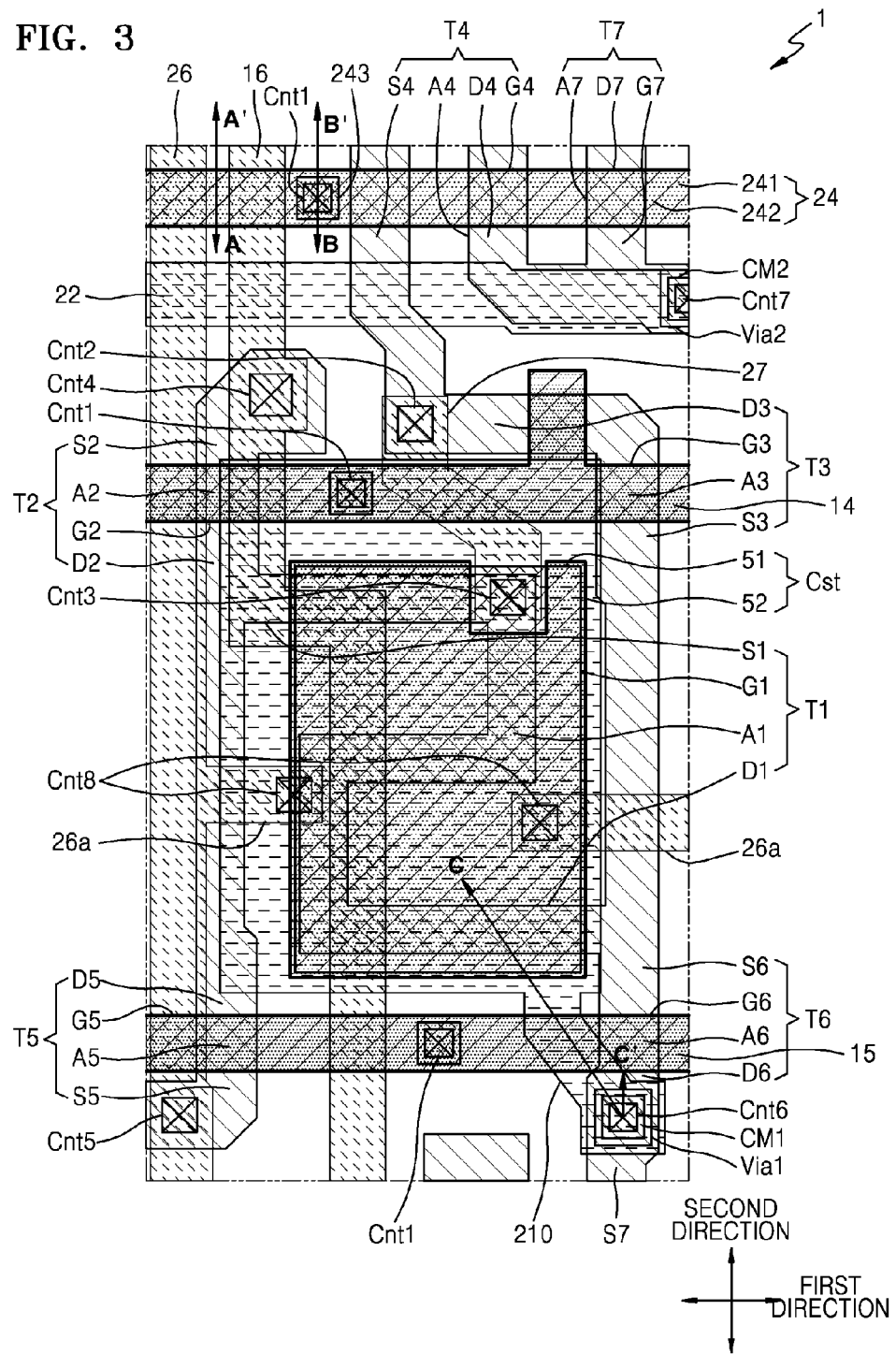
FIG. 3 is a schematic plan view of the pixel included in the display device of FIG. 1.

FIG. 3 is a schematic plan view of the pixel 1 included in the display device according to an embodiment.

Referring to FIG. 3, the pixel 1 includes a plurality of lines 14, 15, 16, 22, 24, and 26, the driving TFT T1, a plurality of switching TFTs T2 through T7, the storage capacitor Cst, and a pixel electrode 210.

The plurality of lines 14, 15, 16, 22, 24, and 26 include first lines extending in a first direction and second lines extending in a second direction that crosses the first direction. The first lines may include the first and second scan lines 14 and 24, the emission control line 15, and the initialization voltage line 22, and the second lines may include the data line 16 and the driving voltage line 26.

At least one of the first and second scan lines 14 and 24 and the emission control line 15 can include a plurality of metal pattern layers 241 and 242 that are electrically connected to each other via a first contact hole Cnt1 to reduce the line's resistance. The structures of the first and second scan lines 14 and 24 and the emission control line 15 that are electrically connected to each other via the contact hole Cnt1 will be described below with reference to FIG. 4.

The driving TFT T1 includes a driving active layer A1, the driving gate electrode G1, the driving source electrode S1, and the driving drain electrode D1. The driving source electrode S1 corresponds to a driving source region doped with impurities in the driving active layer A1 and the driving drain electrode D1 corresponds to a driving drain region doped with impurities in the driving active layer A1. A region between the driving source electrode and the driving drain electrode in the driving active layer A1 corresponds to a driving channel region. The driving gate electrode G1 is connected to the storage capacitor Cst, the compensation drain electrode D3 of the compensation TFT T3, and the first initialization source electrode S4 of the first initialization TFT T4. In one embodiment, the driving gate electrode G1 simultaneously functions as the first electrode 51 of the storage capacitor Cst.

The data transmission TFT T2 includes a data transmission active layer A2, the data transmission gate electrode G2, the data transmission source electrode S2, and the data transmission drain electrode D2. The data transmission source electrode S2 corresponds to a switching source region doped with impurities in the data transmission active layer A2 and the data transmission drain electrode D2 corresponds to a switching drain region doped with impurities in the data transmission active layer A2. The data transmission source electrode S2 is connected to the data line 16 via a fourth contact hole Cnt4. The data transmission drain electrode D2 is connected to the driving TFT T1 and the first emission control TFT T5. A portion of the first scan line 14 becomes the data transmission gate electrode G2.

The compensation TFT T3 includes a compensation active layer A3, the compensation gate electrode G3, the compensation source electrode S3, and the compensation drain electrode D3. The compensation source electrode S3 corresponds to a compensation source region doped with impurities in the compensation active layer A3 and the compensation drain electrode D3 corresponds to a compensation drain region doped with impurities in the compensation active layer A3. The compensation gate electrode G3 that is formed as a dual gate electrode by a portion of the first scan line 14 and a part of a line protruding from the first scan line 14 prevents leakage current.

The first initialization TFT T4 includes a first initialization active layer A4, the first initialization gate electrode G4, the first initialization source electrode S4, and the first initialization drain electrode D4. The first initialization source electrode S4 corresponds to a first initialization source region doped with impurities in the first initialization active layer A4 and the first initialization drain electrode D4 corresponds to a first initialization drain region doped with impurities in the first initialization active layer A4. The first initialization drain electrode D4 is connected to the second initialization TFT T7 and the first initialization source electrode S4 is connected to the driving gate electrode G1 via a connection line 27. A portion of the second scan line 24 becomes the first initialization gate electrode G4.

The connection line 27 extends in the second direction, and electrically connects the first initialization TFT T4 and the driving TFT T1 to each other via second and third contact holes Cnt2 and Cnt3. The connection wire 27 can be located in the same layer as the data line 16 and the driving voltage line 26 and can be formed of the same material as the data line 16 and the driving voltage line 26.

The first emission control TFT T5 includes a first emission control active layer A5, the first emission control electrode G5, the first emission control source electrode S5, and the first emission control drain electrode D5. The first emission control source electrode S5 corresponds to a first emission control source region doped with impurities in the first emission control active layer A5 and the first emission control drain electrode D5 corresponds to a first emission control drain region doped with impurities in the first emission control active layer A5. The first emission control source electrode S5 is connected to the driving voltage line 26 via the fifth contact hole Cnt5. A portion of the emission control line 15 becomes the first emission control gate electrode G5.

The second emission control TFT T6 includes a second emission control active layer A6, the second emission control gate electrode G6, the second emission control source electrode S6, and the second emission control drain electrode D6. The second emission control source electrode S6 corresponds to a second emission control source region doped with impurities in the second emission control active layer A6 and the second emission control drain electrode D6 corresponds to a second emission control drain region doped with impurities in the second emission control active layer A6. The second emission control drain electrode D6 is connected to a first cover metal CM1 via a sixth contact hole Cnt6 and the first cover metal CM1 is connected to the pixel electrode 210 of the OLED via a first via hole via1. A portion of the emission control line 15 becomes the second emission control gate electrode G6. The first cover metal CM1 can be located on the same layer as the data line 16 and the driving voltage line 26 and formed of the same material as the data line 16 and the driving voltage line 26.

The second initialization TFT T7 includes a second initialization active layer A7, the second initialization gate electrode G7, the second initialization source electrode S7, and the second initialization drain electrode D7. The second initialization source electrode S7 corresponds to a second initialization source region doped with impurities in the second initialization active layer A7 and the second initialization drain electrode D7 corresponds to a second initialization drain region doped with impurities in the second initialization active layer A7. The second initialization drain electrode D7 is connected to a second cover metal CM2 via a seventh contact hole Cnt7 and the second cover metal CM2 can be connected to the initialization voltage line 22 via a second via hole via2. A portion of the second scan line 24 becomes the second initialization gate electrode G7. The second initialization source electrode S7 is connected to the pixel electrode 210 of the OLED via the first cover metal CM1. The second cover metal CM2 can be located on the same layer as the data line 16 and the driving voltage line 26 and formed of the same material as the data line 16 and the driving voltage line 26.

The first electrode 51 of the storage capacitor Cst is directly connected to the driving gate electrode G1 and the first electrode 51 can overlap the driving active layer A1. The first electrode 51 of the storage capacitor Cst can simultaneously function as the driving gate electrode G1. The first electrode 51 is connected to the first initialization TFT T4 through the connection line 27 contacting thereto via the third contact hole Cnt3. The third contact hole Cnt3 is formed on the driving gate electrode G1 so as to expose a portion of the driving gate electrode G1 (or the first electrode 51 of the storage capacitor Cst).

The second electrode 52 of the storage capacitor Cst is formed to overlap the first electrode 51. The second electrode 52 is electrically connected to a branch line 26a of the driving voltage line 26 of the corresponding pixel 1 and the branch line 26a extending from a driving voltage line (not shown) of a neighboring pixel (not shown) via an eighth contact hole Cnt8 to form a mesh structure.

The pixel electrode 210 is formed on a fourth insulating layer 105 that is planarization layer formed on the substrate 100 and is electrically connected to the second emission control TFT T6 via the first via hole via1.

The initialization voltage line 22 can be located on the same layer as the pixel electrode 210, but one or more embodiments of the described technology are not limited thereto. For example, in another embodiment, the initialization voltage line 22 includes a plurality of metal pattern layers like the first and second scan lines 14 and 24 and the emission control line 15.

Figure 4:
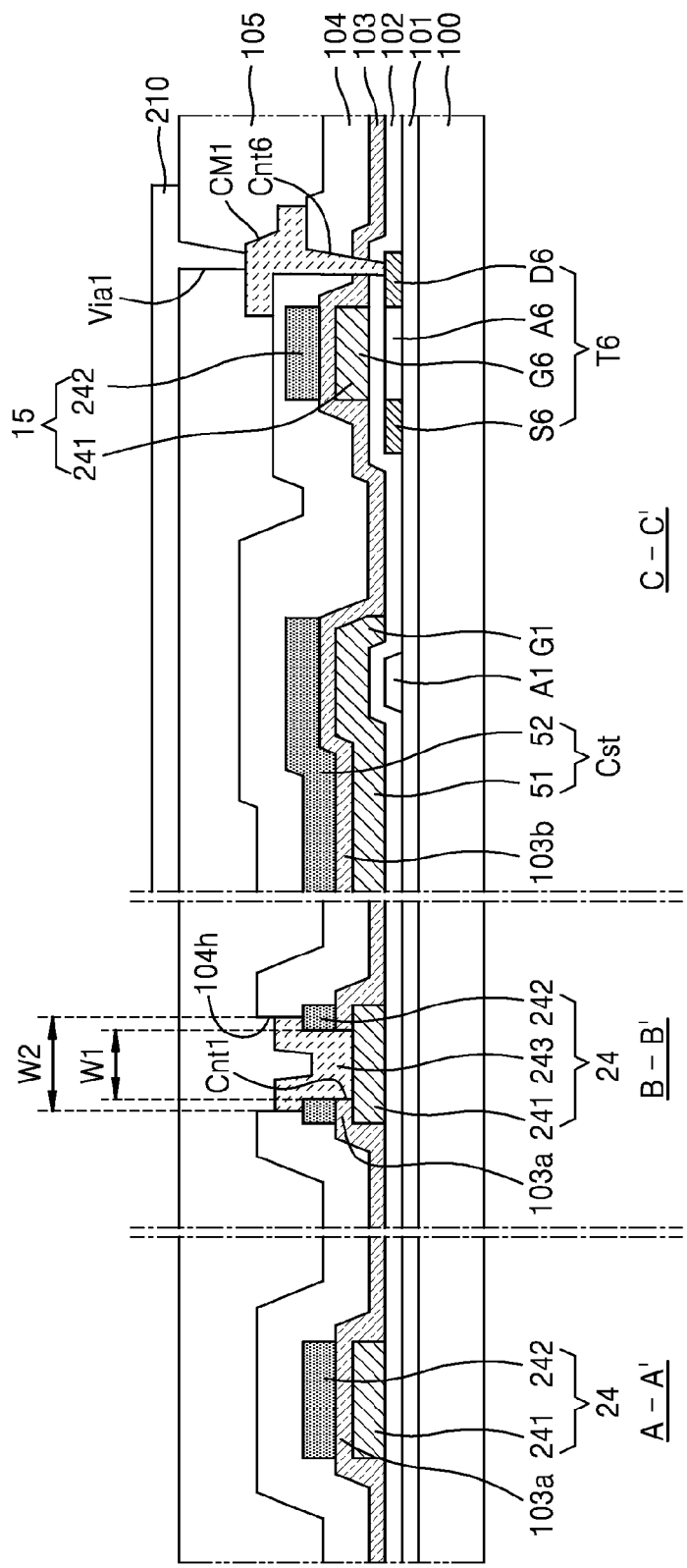
FIG. 4 is a cross-sectional view of the display device taken along lines A-A', B-B', and C-C' of FIG. 3.

FIG. 4 is a cross-sectional view of the display device taken along lines A-A', B-B', and C-C' of FIG. 3.

Referring to FIG. 4, a buffer layer 101 is formed on the substrate 100 and the active layers A1 through A7 (see FIG. 3) are formed on the buffer layer 101. FIG. 4 shows a portion of the active layer A1 that is not doped with impurities in the driving TFT T1. The second emission control source electrode S6 and the second emission control drain electrode D6 are doped with impurities.

A first insulating layer 102, that is, a first gate insulating layer, is formed on the active layers A1 through A7 (see FIG. 3) and a first metal pattern including the first metal pattern layer 241 and the first electrode 51 of the storage capacitor Cst is formed over the first insulating layer 102. A second insulating layer 103 that is a second gate insulating layer, a second metal pattern including the second metal pattern layer 242 and the second electrode 52 of the storage capacitor Cst, a third insulating layer 104 that is an interlayer insulating layer, and a fourth insulating layer 105 that is a planarization layer are sequentially formed over the first metal pattern. The first through fourth insulating layers 102 through 105 include an inorganic material and/or an organic material.

The second scan line 24 includes the first metal pattern layer 241 formed on the first insulating layer 102, and the second metal pattern layer 242 formed on the first metal pattern layer 241 with an intermediate insulating layer 103a interposed between the first and second metal pattern layers 241 and 242. The first and second metal pattern layers 241 and 242 are connected to each other via a third metal pattern layer 243.

The first and second metal pattern layers 241 and 242 extend in the first direction to form the second scan line 24 as shown in FIG. 3. The first and second metal pattern layers 241 and 242 have the substantially the same pattern and the second scan line 24 formed by the first and second metal pattern layers 241 and 242 has a resistance that is less than the second scan line formed as a single layer including the first metal pattern layer 241. The third metal pattern layer 243 is an island type layer and electrically connects the first and second metal pattern layers 241 and 242 to each other.

The first contact hole Cnt1 penetrates through the intermediate insulating layer 103a and the second metal pattern layer 242 so as to expose an upper surface of the first metal pattern layer 241 and the third metal pattern layer 243 electrically connects the first and second metal pattern layers 241 and 242 to each other via the first contact hole Cnt1. For example, the third metal pattern layer 243 contacts a portion of the upper surface of the first metal pattern layer 241 exposed through the first contact hole Cnt1 and side and upper surfaces of the second metal pattern layer 242 to electrically connect the first and second metal pattern layers 241 and 242 to each other.

The third insulating layer 104 that is the interlayer insulating layer is located on the second metal pattern layer 242 and the third insulating layer 104 includes a through hole 104h corresponding to the first contact hole Cnt1. An inner diameter W2 of the through hole 104h can be greater than an outer diameter W1 of the first contact hole Cnt1 so as to expose the upper surface of the second metal pattern layer 242, as well as the upper surface of the first metal pattern layer 241. Since the upper surface of the second metal pattern layer 242 is exposed, the third metal pattern layer 243 can contact the upper surface of the second metal pattern layer 242, as well as the side surface of the second metal pattern layer 242, to ensure a sufficient contact area therebetween.

In FIG. 4, the third metal pattern layer 243 is located in the through hole 104h, but is not limited thereto. As another embodiment, an end portion of the third metal pattern layer 243 has a greater size than the through hole 104h so as to extend to an upper surface of the third insulating layer 104.

The first metal pattern layer 241 is located on the same layer as the first electrode 51 of the storage capacitor Cst and can include the same material as that included in the first electrode 51. The second metal pattern layer 242 can be located on the same layer as the second electrode 52 of the storage capacitor Cst and can include the same material as that included in the second electrode 52. The intermediate insulating layer 103a can be located on the same layer as a dielectric layer 103b interposed between the first and second electrodes 51 and 52 of the storage capacitor Cst by using the same material as that of the dielectric layer 103b. The third metal pattern layer 243 can be located on the same layer as the second lines by using the same material as the second lines. For example, the third metal pattern layer 243 can be located on the same layer as the data line 16 and the driving voltage line 26 by using the same material as that forming the data line 16 and the driving voltage line 26.

As described above, the metal pattern layers 241, 242, and 243 forming the second scan line 24 can be respectively formed at the same levels as the first and second electrodes 51 and 52 of the storage capacitor Cst and the data line 16 by using the same materials as that of the first and second electrodes 51 and 52 and the data line 16. Therefore, the resistance of the second scan line 24 can be reduced without forming an additional metal pattern layer.

The detailed structure of the second scan line 24 is described above, but the first scan line 14 and the emission control line 15 can have the same structure as that of the second scan line 24.

According to the embodiments of the described technology, since the first and second scan lines 14 and 24 and the emission control line 15 include the metal pattern layers 241 and 242, the resistance of the lines can be reduced, and accordingly, the RC delay of the display device can be prevented or reduced.

FIGS. 5A through 5F are cross-sectional views illustrating a method of manufacturing a display device, according to an embodiment. Each of the manufacturing processes will be described with reference to FIGS. 5A through 5F, and FIG. 3 for convenience of description.

Figure 5A:
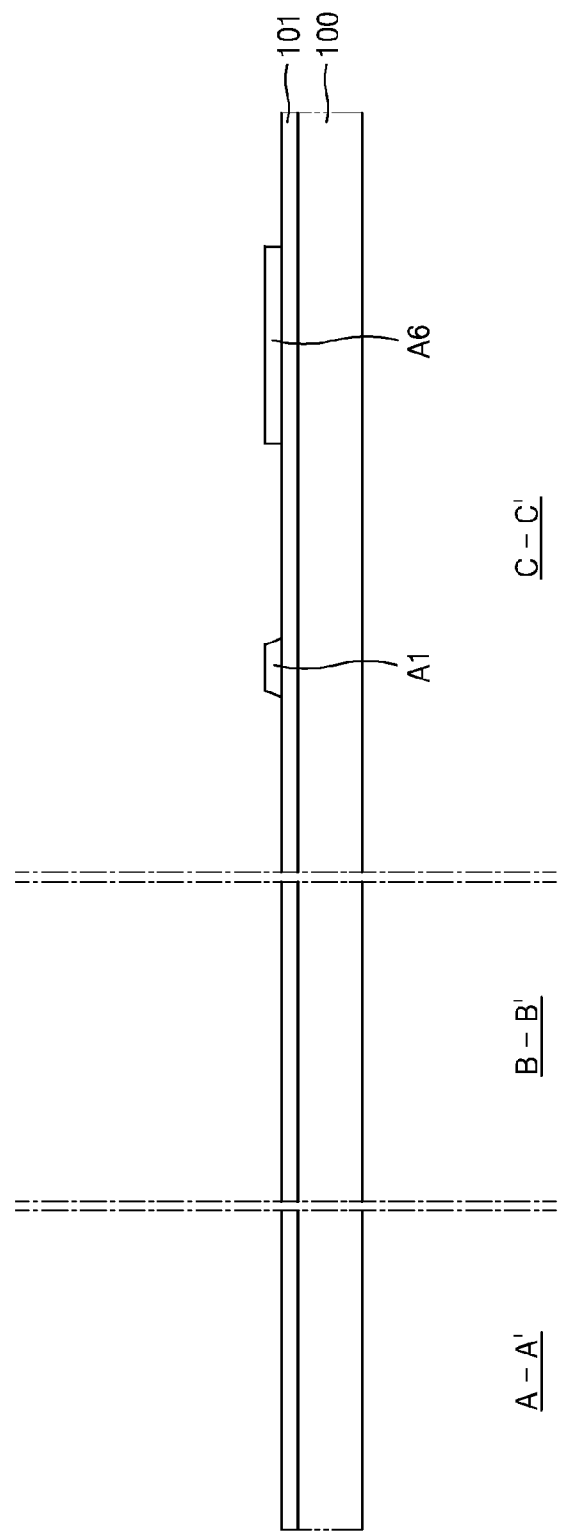
FIGS. 5A through 5F are cross-sectional views illustrating a method of manufacturing the display device according to an embodiment.

FIG. 5A is a cross-sectional view illustrating a first mask process.

Referring to FIG. 5A and FIG. 3, a semiconductor layer (not shown) is formed on the substrate 100, on which the buffer layer 101 is formed, and is patterned to form the active layers A1 through A7 of the TFTs. The active layers A1 through A7 may be formed of amorphous silicon, polycrystalline silicon, or oxide semiconductor such as an I-G-Z—O layer ([($In_2O_3$)a($Ga_2O_3$)b(ZnO)c layer](a, b, and c are respectively real numbers satisfying the conditions a≥0, b≥0, and c>0).

Figure 5B:
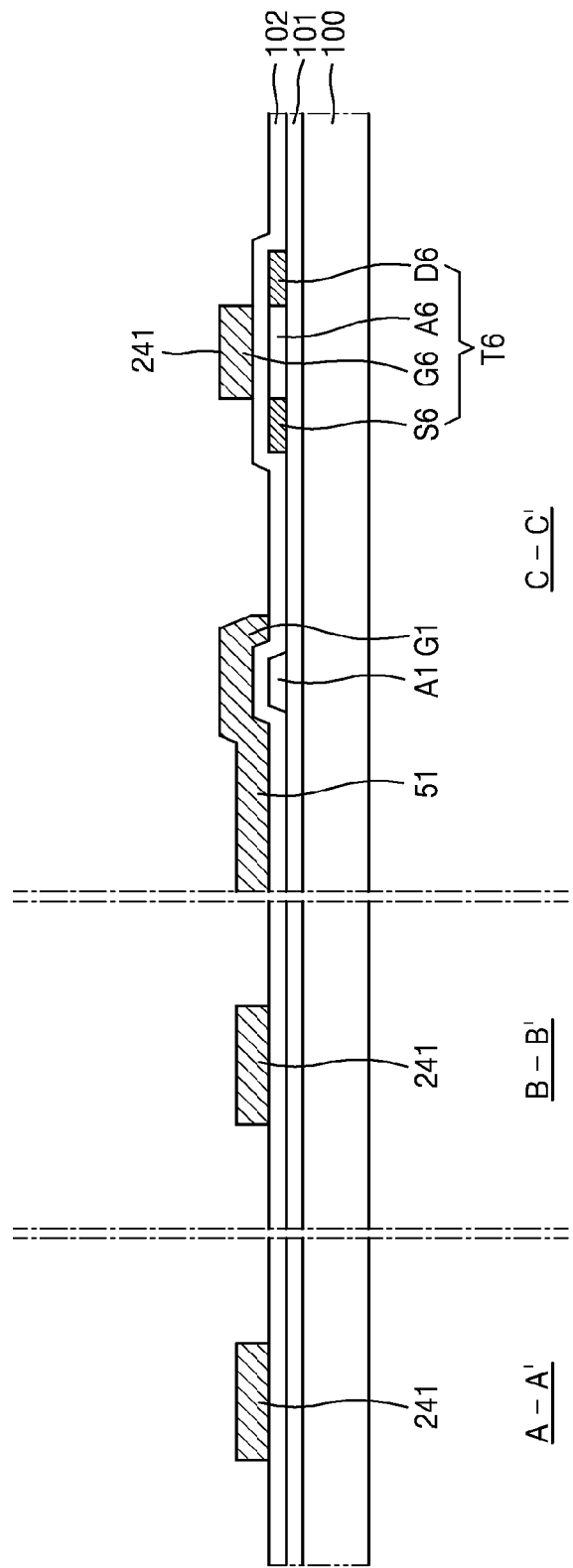

FIG. 5B is a cross-sectional view showing a second mask process.

Referring to FIG. 5B and FIG. 3, the first insulating layer 102 is formed on an entire surface of the substrate 100 and the first metal layer (not shown) is formed and patterned to form the first metal pattern layer 241 and the first electrode 51 of the storage capacitor Cst. Therefore, the first metal pattern layer 241 and the first electrode 51 of the storage capacitor Cst can be formed of the same material at the same level as each other.

The first insulating layer 102 is a first gate insulating layer covering the active layers A1 through A7. The first insulating layer 102 may be formed of an organic and/or inorganic electrically insulating material. For example, the first insulating layer 102 may be formed of silicon nitride (SiNx), silicon oxide ($SiO_2$), hafnium oxide, or aluminum oxide.

The first metal layer may include one or more of the following materials: molybdenum (Mo), aluminum (Al), palladium (Pd), silver (Ag), magnesium (Mg), gold (Au), nickel (Ni), neodymium (Nd), iridium (Jr), chromium (Cr), lithium (Li), calcium (Ca), titanium (Ti), tungsten (W), and copper (Cu).

The first metal pattern layer 241 is patterned on a location corresponding to the second scan line 24, the first scan line 14, and the emission control line 15 to extend along the first direction (refer to FIG. 3). Portions of the second scan line 24, the first scan line 14, and the emission control line 15 become the gate electrodes G2 through G7 of the switching TFTs T2 through T7.

The first electrode 51 of the storage capacitor Cst overlaps with the channel region of the active layer A1 of the driving TFT T1 as a floating electrode. That is, the first electrode 51 of the storage capacitor Cst functions as the driving gate electrode G1 of the driving TFT T1.

Impurities are injected into the active layers A1 through A7 by using the first metal pattern layer 241 and the first electrode 51 of the storage capacitor Cst as masks, and thus, the source electrodes S1 through S7, and the drain electrodes D1 through D7 are formed. The impurities may vary depending on the type of TFTs employed, that is, they may be N-type impurities or P-type impurities.

Figure 5C:
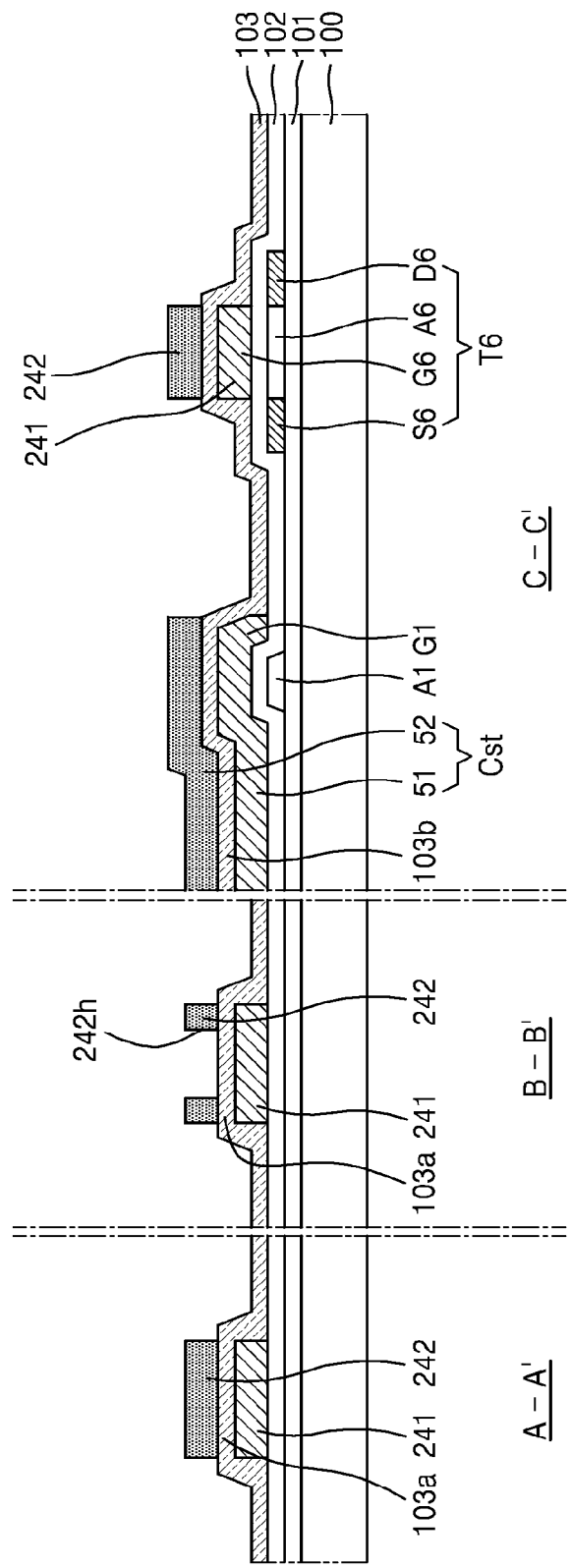

FIG. 5C is a cross-sectional view illustrating a third mask process.

Referring to FIG. 5C and FIG. 3, the second insulating layer 103 is formed on the entire surface of the substrate 100 and the second metal layer (not shown) is formed and patterned to form the second metal pattern layer 242 and the second electrode 52 of the storage capacitor Cst. Therefore, the second metal pattern layer 242 and the second electrode 52 of the storage capacitor Cst can be formed of the same material at the same level as each other.

The second insulating layer 103 is a second gate insulating layer and may be formed of an organic and/or inorganic electrically insulating material. As an embodiment, the second insulating layer 103 can be formed of SiNx, $SiO_2$, hafnium oxide, or aluminum oxide. A portion of the second insulating layer 103 forms the intermediate insulating layer 103a arranged on the first metal pattern layer 241 and another portion of the second insulating layer 103 forms the dielectric layer 103b arranged on the first electrode 51 of the storage capacitor Cst.

The second metal layer may include one or more of the following materials: molybdenum (Mo), aluminum (Al), palladium (Pd), silver (Ag), magnesium (Mg), gold (Au), nickel (Ni), neodymium (Nd), iridium (Jr), chromium (Cr), lithium (Li), calcium (Ca), titanium (Ti), tungsten (W), and copper (Cu).

The second metal pattern layer 242 extends in the first direction (refer to FIG. 3) and can have substantially the same pattern as the first metal pattern layer 241. The metal pattern layer 242 includes the first hole 242h at a location corresponding to a location where the first contact hole will be formed. An upper surface of the second insulating layer 103 is exposed through the first hole 242h. The second electrode 52 of the storage capacitor Cst overlaps with the first electrode 51 as a floating electrode.

Figure 5D:
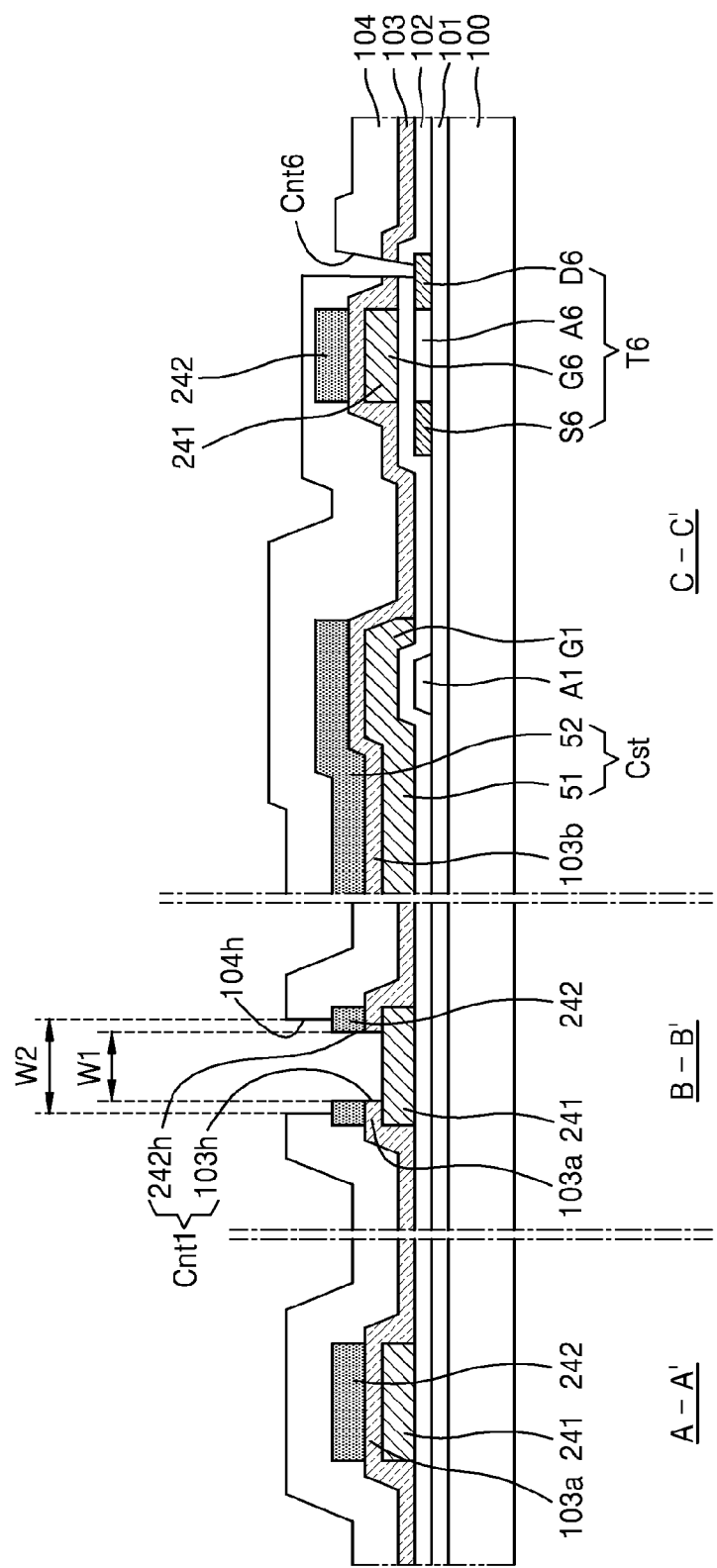

FIG. 5D is a cross-sectional view illustrating a fourth mask process.

Referring to FIG. 5D and FIG. 3, the third insulating layer 104 is formed on the entire surface of the substrate 100 and the through hole 104h and the first through eighth contact holes Cnt1 through Cnt8 are formed.

The third insulating layer 104 is an interlayer insulating layer formed of an organic and/or inorganic electrically insulating material. According to the present embodiment, the third insulating layer 104 may include $SiO_2$, SiNx, silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$).

When forming the through hole 104h, a portion of the intermediate insulating layer 103a exposed through the first hole 242h is removed, and thus, a second hole 103h exposing the upper surface of the first metal pattern layer 241 is formed in the intermediate insulating layer 103a. The first hole 242h and the second hole 103h overlap with each other and the centers of the first hole 242h and the second hole 103h are substantially aligned. The first hole 242h and the second hole 103h have substantially the same size as each other and form the first contact hole Cnt1.

The through hole 104h in the third insulating layer 104 has a size that is greater than that of the first contact hole Cnt1. For example, the inner diameter W2 of the through hole 104h of the third insulating layer 104 is greater than the outer diameter W1 of the first contact hole Cnt1 so that an upper surface of the second metal pattern layer 242 can be exposed through the through hole 104h.

The second contact hole Cnt2 exposes the first initialization source electrode S4 of the first initialization TFT T4, the third contact hole Cnt3 exposes the first electrode 51 of the storage capacitor Cst, the fourth contact hole Cnt4 exposes the data transmission source electrode S2, the fifth contact hole Cnt5 exposes the first emission control source electrode S5, the sixth contact hole Cnt6 exposes the second emission control drain electrode D6, and the seventh contact hole Cnt7 exposes the second initialization drain electrode D7. The eighth contact hole Cnt8 exposes the second electrode 52 of the storage capacitor Cst.

Figure 5E:
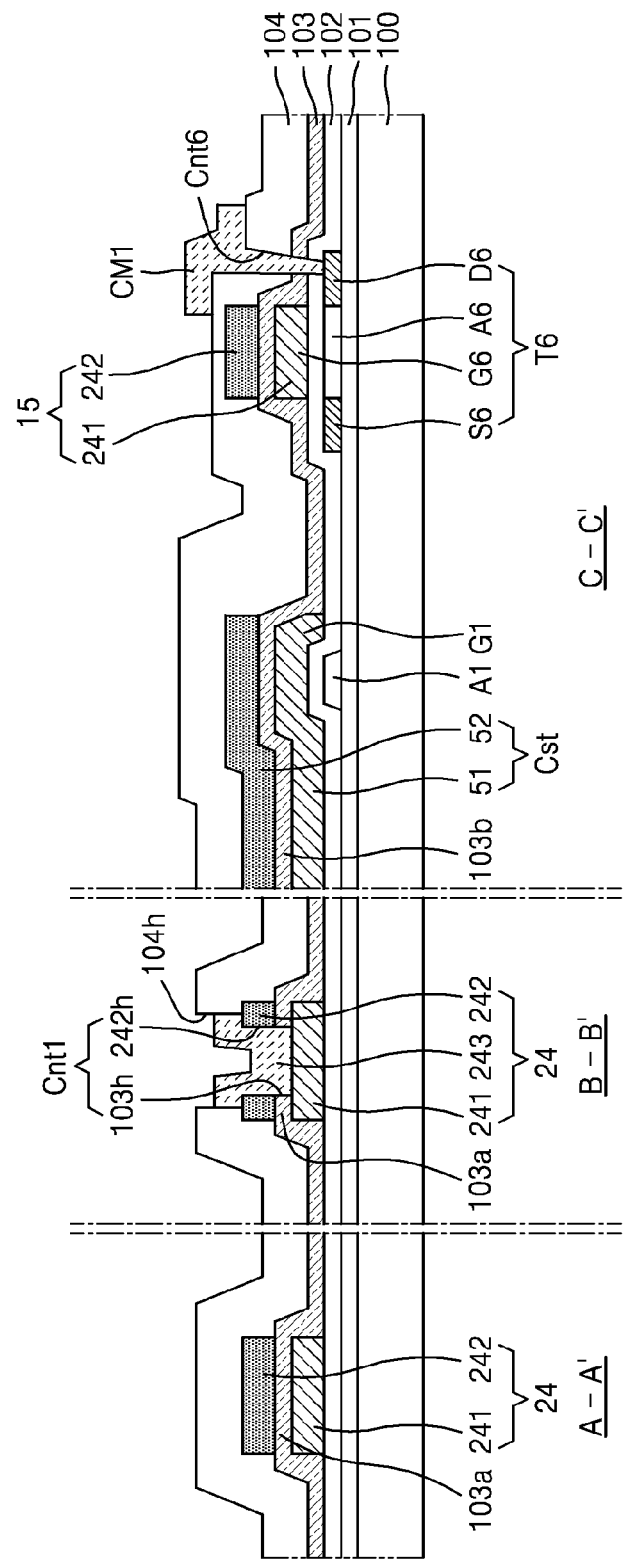

FIG. 5E is a cross-sectional view illustrating a fifth mask process.

Referring to FIG. 5E and FIG. 3, a third metal layer (not shown) is formed and patterned to form the third metal pattern layer 243, the data line 16, the driving voltage line 26, the connection line 27, and the first and second cover metals CM1 and CM2. Therefore, the third metal pattern layer 243, the data line 16, the driving voltage line 26, the connection line 27, and the first and second cover metals CM1 and CM2 are formed of the same material at the same level.

The third metal layer may include two or more metal layers of the following materials: Al, Pt, Pd, Ag, Mg, Au, Ni, Nd, Jr, Cr, Li, Ca, Mo, Ti, W, Cu, and an alloy thereof.

The third metal pattern layer 243 is an island type pattern and contacts the first metal pattern layer 241 and the second metal pattern layer 242 exposed through the first contact hole Cnt1 and the through hole 104h to electrically connect the first and second metal pattern layers 241 and 242 to each other. For example, the third metal pattern layer 243 contacts a portion of the upper surface of the first metal pattern layer 241 and the side and upper surfaces of the second metal pattern layer 242.

The first metal pattern layer 241 and the second metal pattern layer 242 have the same patterns extending in the first direction and are electrically connected to each other via the third metal pattern layer 243. Each of the first and second scan lines 14 and 24 and the emission control line 15 having the multi-layered, (e.g. dual-layered) structure of the first and second metal pattern layers 241 and 242 has a resistance that is less than that of a single metal pattern layer, and thus, the RC delay of the display device can be reduced or prevented due to the reduction in the resistance.

The data line 16 and the driving voltage line 26 extend in the second direction. The data line 16 is connected to the data transmission source electrode S2 via the fourth contact hole Cnt4. The driving voltage line 26 is connected to the first emission control source electrode S5 via the fifth contact hole Cnt5 and is connected to the second electrode 52 of the storage capacitor Cst via the eighth contact hole Cnt8 to form a mesh structure. Accordingly, the second electrode 52 of the storage capacitor Cst can maintain an electric potential at a constant level.

The connection line 27 electrically connects the first initialization TFT T4 and the driving TFT T1 to each other via the second and third contact holes Cnt2 and Cnt3.

The first cover metal CM1 is connected to the second emission control drain electrode D6 via the sixth contact hole Cnt6 and the second cover metal CM2 is connected to the second initialization drain electrode D7 via the seventh contact hole Cnt7.

Figure 5F:
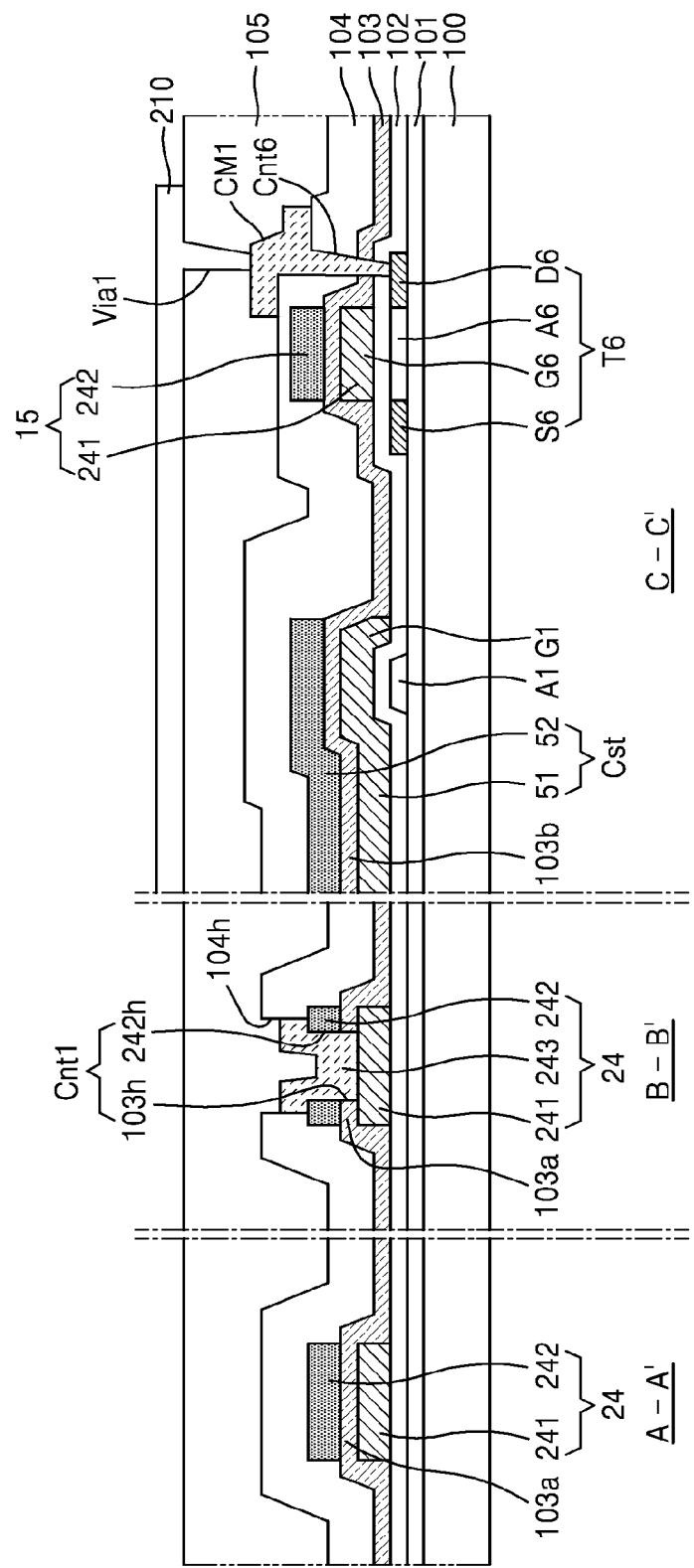

FIG. 5F is a cross-sectional view illustrating sixth and seventh mask processes.

Referring to FIG. 5F and FIG. 3, the fourth insulating layer 105 that is a planarization layer is formed on the entire surface of the substrate and the first and second via holes via1 and via2 penetrating through the fourth insulating layer 105 are formed (the sixth mask process). The first via hole via1 is formed at a location corresponding to the sixth contact hole Cnt6 to expose the first cover metal CM1 and the second via hole via2 is formed at a location corresponding to the seventh contact hole Cnt7 to expose the second cover metal CM2.

Thereafter, the pixel electrode 210 and the initialization voltage line 22 are formed (the seventh mask process).

The pixel electrode 210 is connected to the first cover metal CM1 through the first via hole via1 and then is connected to the second emission control TFT T6 via the first cover metal CM1. The initialization voltage line 22 is connected to the second initialization TFT T7 through the second via hole via2.

Although not shown in drawings, a pixel defining layer (not shown) exposing an upper surface of the pixel electrode 210 is formed (an eighth mask process) and an intermediate layer including an organic emission layer is formed in an opening defined by the pixel defining layer. An opposite electrode (not shown) covering the pixels 1 is formed on the entire surface of the substrate to manufacture the display device, for example, as an OLED display.

In the present embodiment, the organic emission layer is interposed between the pixel electrode 210 and the opposite electrode, but one or more embodiments are not limited thereto. As another embodiment, a liquid crystal layer may be arranged between the pixel electrode 210 and the opposite electrode to form a liquid crystal display (LCD).

Figure 6:
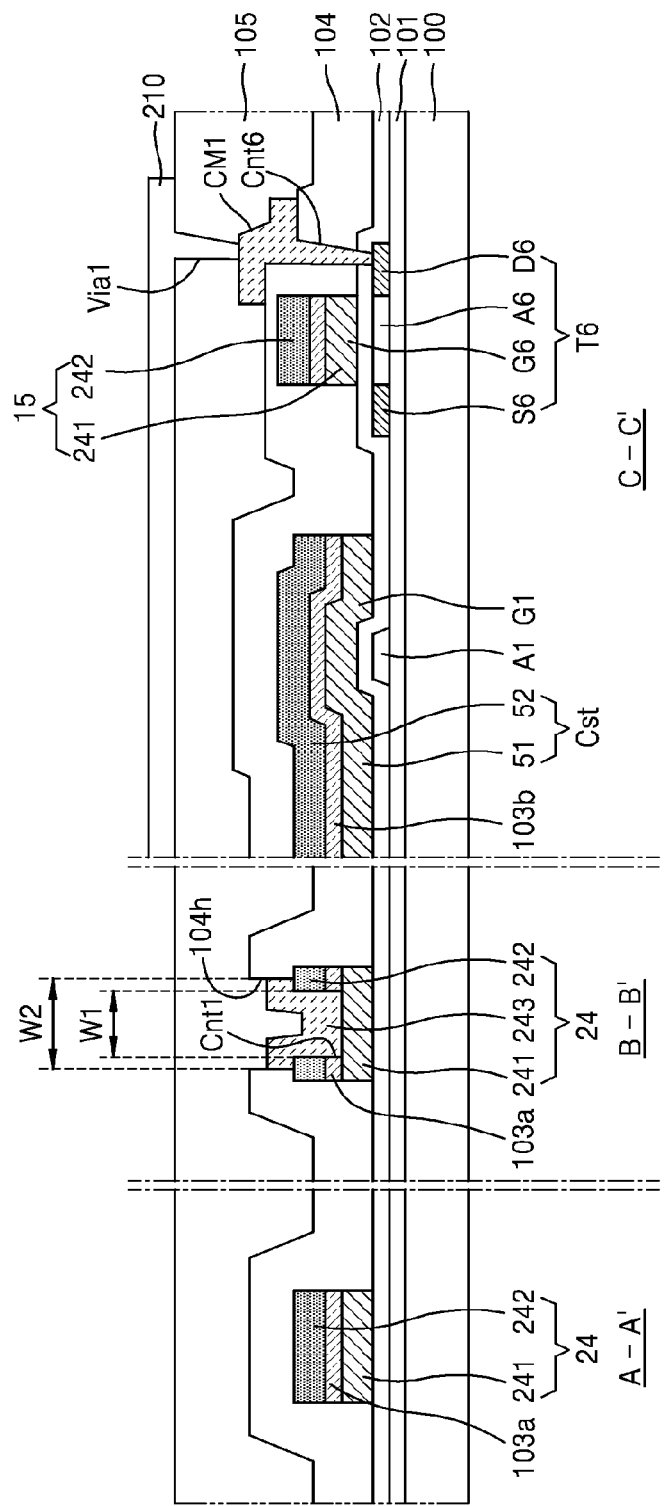
FIG. 6 is a cross-sectional view of a display device taken along lines A-A', B-B', and C-C' of FIG. 3 according to another embodiment.

FIG. 6 is a cross-sectional view of a display device according to another embodiment. The cross-sectional view of FIG. 6 corresponds to the cross-sections taken along lines A-A', B-B', and C-C' of FIG. 3.

Referring to FIG. 6, the first metal pattern layer 241, the second metal pattern layer 242, and the intermediate insulating layer 103a interposed between the first and second metal pattern layers 241 and 242 may have substantially the same pattern as each other. In addition, the first and second electrodes 51 and 52 of the storage capacitor Cst and the dielectric layer 103b interposed between the first and second electrodes 51 and 52 and formed of the same material at the same level as the intermediate insulating layer 103a may have substantially the same pattern as each other.

The display device according to the FIG. 6 embodiment includes a structure in which the intermediate insulating layer 103a and the dielectric layer 103b are patterned in contrast to the display device described above with reference to FIG. 4. The display device of FIG. 6 is obtained by differentiating the method of manufacturing the display device and the method according to the present embodiment will be described below.

FIGS. 7A through 7H are cross-sectional views illustrating processes of manufacturing the display device according to another embodiment. The processes will be described with reference to FIGS. 7A through 7H and FIG. 3 together for convenience of description.

Figure 7A:
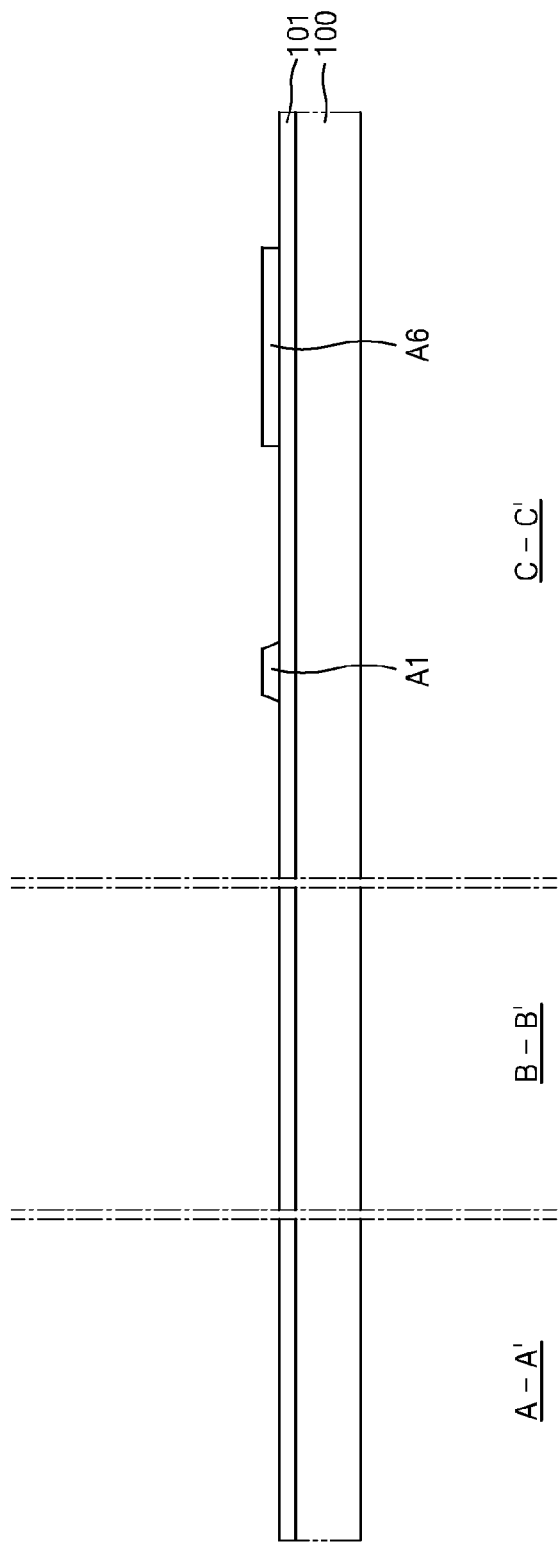

FIG. 7A is a cross-sectional view of a first mask process.

Referring to FIG. 7A and FIG. 3, a semiconductor layer (not shown) is formed on the substrate 100 on which the buffer layer 101 is formed and is patterned to form the active layers A1 through A7. The semiconductor layer can be formed by using the materials described above.

FIGS. 7B through 7E are cross-sectional views illustrating a second mask process.

Figure 7B:
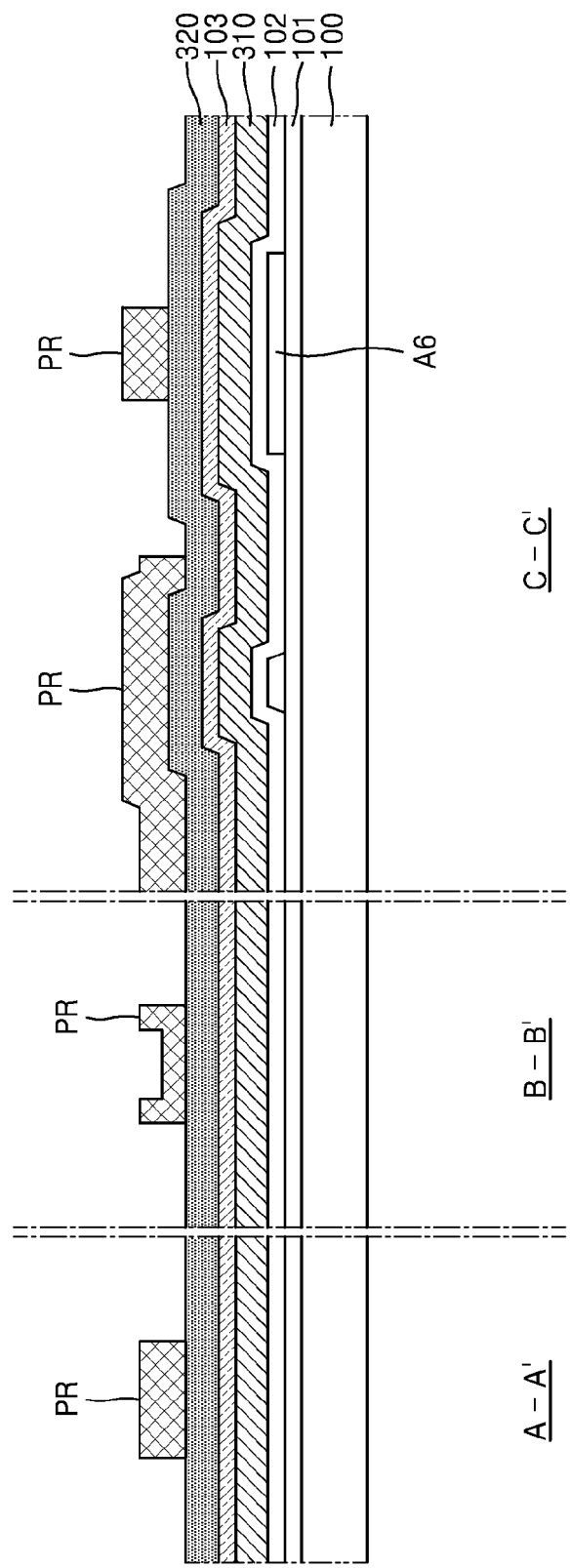
Figure 7D:
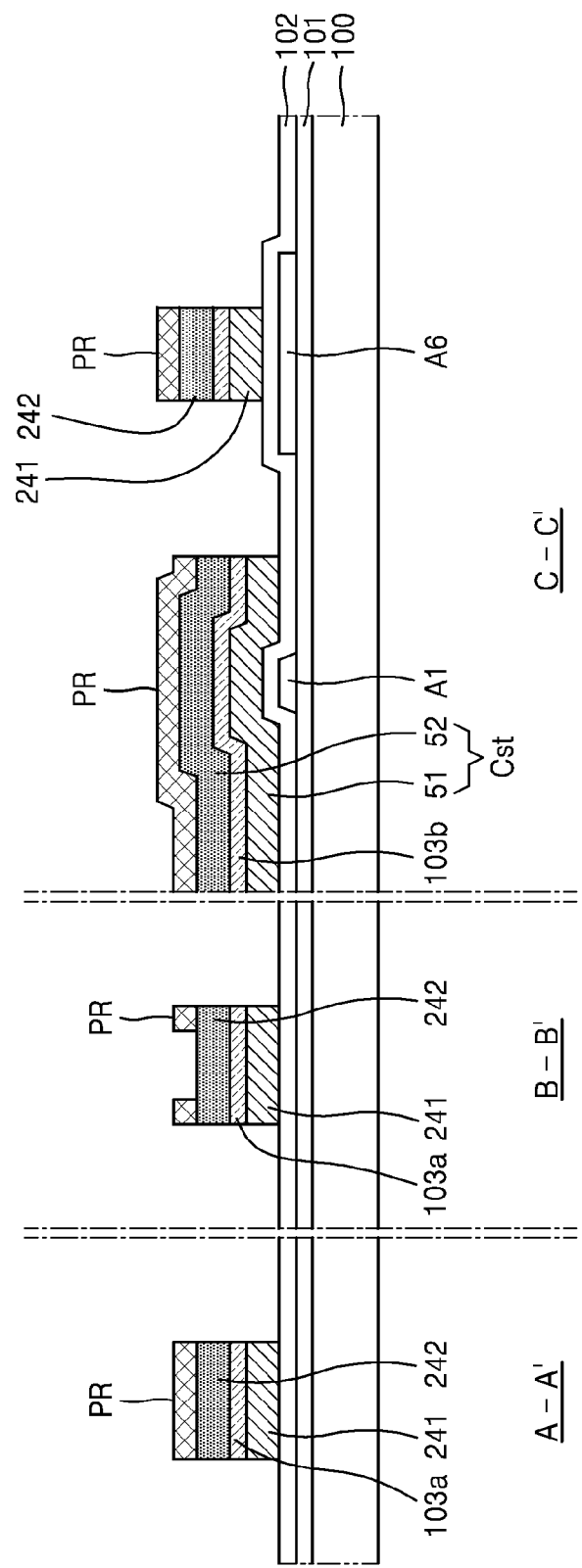

Referring to FIG. 7B, a first metal layer 310, the second insulating layer, and a second metal layer 320 are sequentially formed on an entire surface of the substrate 101. The first metal layer 310, the second insulating layer 103, and the second metal layer 320 can be formed of the materials described above in the previous embodiment. After that, a photoresist PR is formed on a region where a patterning operation is necessary by using a half-tone mask. In the photoresist PR shown in FIG. 7B, a region that is thinner than the other region corresponds to a half-tone region of the half-tone mask.

Referring to FIG. 7C, the first metal layer 310, the second insulating layer 103, and the second metal layer 320 are patterned at the same time by using the photoresist PR as a mask. The patterning can be performed by using a dry-etching method, but is not limited thereto. As a result of the patterning operation, the first metal pattern layer 241, the intermediate insulating layer 103a, the second metal pattern layer 242, the first and second electrodes 51 and 52 of the storage capacitor Cst, and the dielectric layer 103b are formed. The first electrode 51 of the storage capacitor Cst is formed on the driving active layer A1 and functions as the driving gate electrode G1.

Figure 7E:
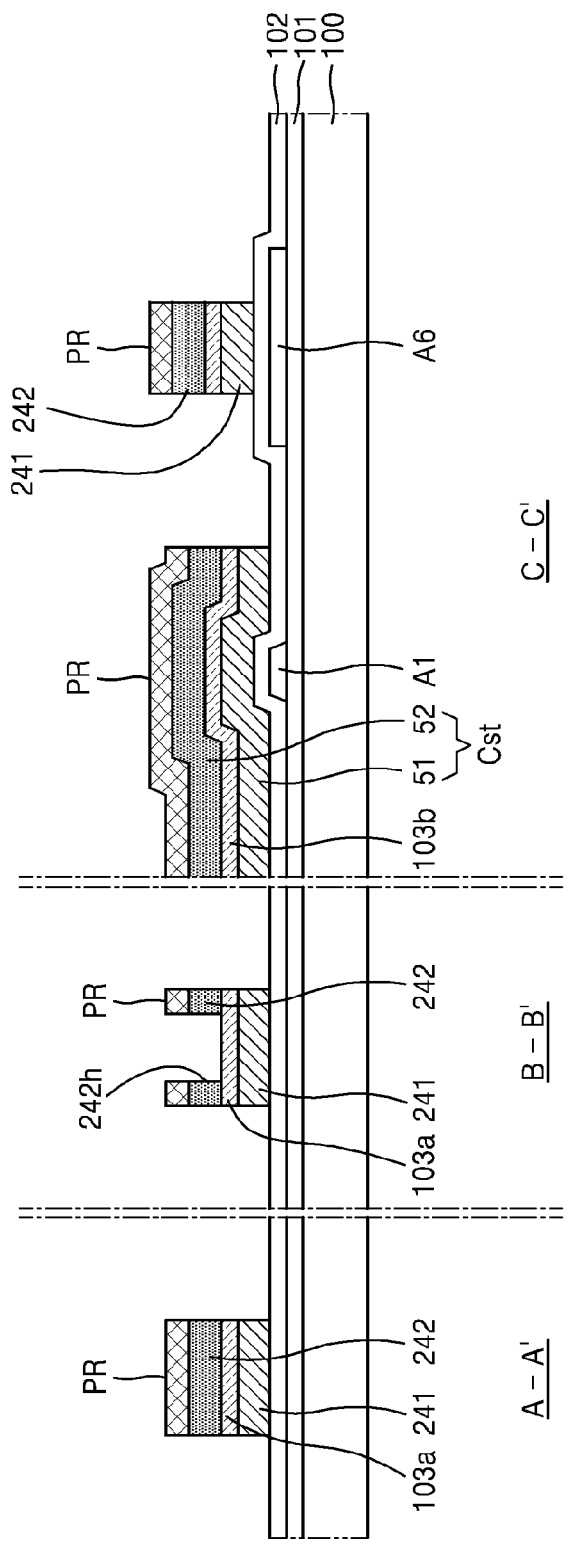

After that, an ashing process is performed (refer to FIG. 7D) and a patterning is performed by using the remaining photoresist PR as a mask (refer to FIG. 7E). The patterning can be performed by using the dry-etching method, but is not limited thereto. As a result of the patterning operation, the first hole 242h is formed in the second metal pattern layer 242.

Next, the remaining photoresist PR is removed, and impurities are implanted by using the patterned first and second metal layers as masks. Alternatively, the impurities are implanted by using the patterned first and second metal layers as masks, and then, the remaining photoresist PR is removed. When implanting the impurities, the source electrodes S1 through S7 and the drain electrodes D1 through D7 may be formed (refer to FIG. 3).

FIG. 7F shows a third mask process.

Referring to FIG. 7F and FIG. 3, the third insulating layer 104 is formed on the entire surface of the substrate 100 and is patterned to form the through hole 104h and the first through eighth contact holes Cnt1 through Cnt8.

When forming the through hole 104f, the intermediate insulating layer 103a exposed through the first hole 242h is removed so that the second hole 103h exposing the upper surface of the first metal pattern layer 241 is formed in the intermediate insulating layer 103a. The first hole 242h and the second hole 103h overlap with each other, and have substantially the same size as each other to form the first contact hole Cnt1.

Figure 7G:
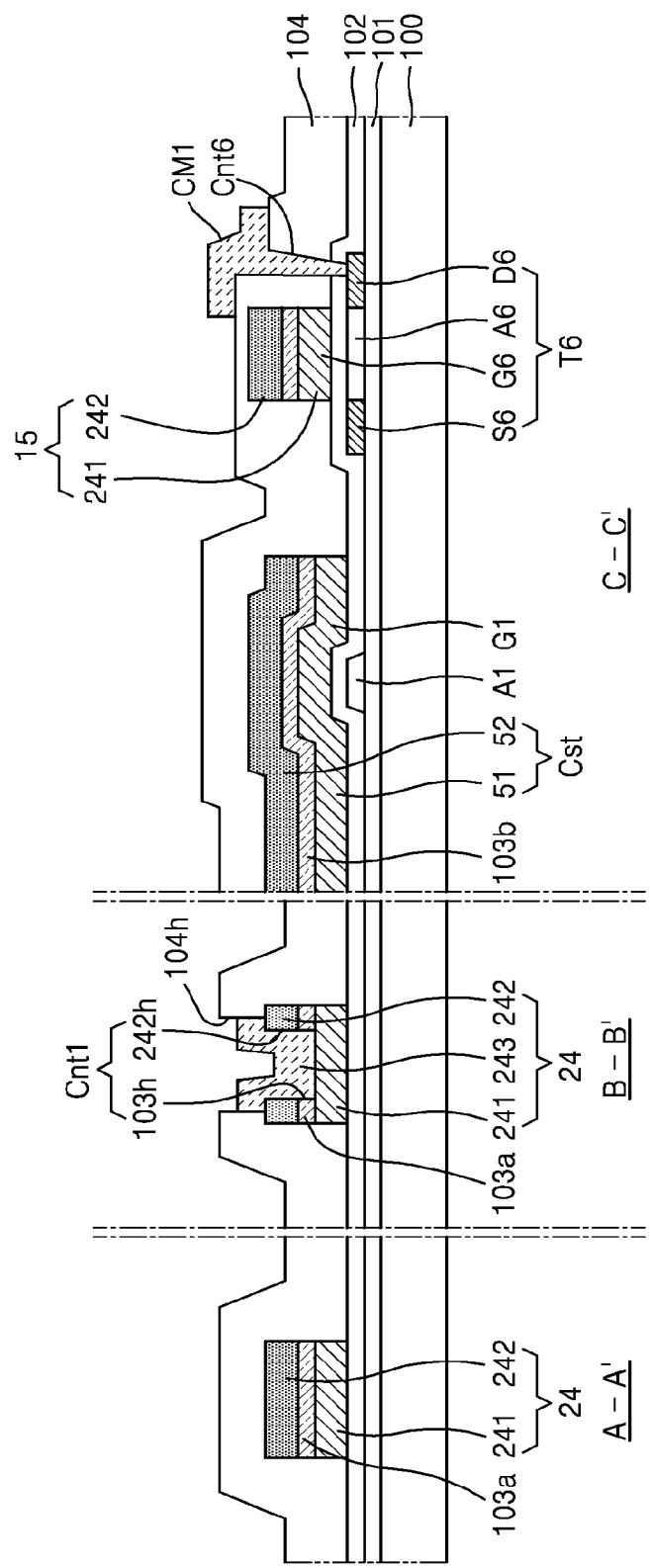

FIG. 7G shows a fourth mask process.

Referring to FIGS. 7G and 3, A third metal layer (not shown) is formed and patterned to form the third metal pattern layer 243, the data line 16, the driving voltage line 26, the connection line 27, and the first and second cover metals CM1 and CM2.

The third metal pattern layer 243 is an island type layer and is formed on a location corresponding to the first contact hole Cnt1. The third metal pattern layer 243 contacts the first and second metal pattern layers 241 and 242 to electrically connect the first and second metal pattern layers 241 and 242 to each other. For example, the third metal pattern layer 243 can contact a portion of the upper surface of the first metal pattern layer 241 exposed through the first contact hole Cnt1 and the side and upper surfaces of the second metal pattern layer 242.

The first and second metal pattern layers 241 and 242 have substantially the same pattern as each other and extend in the first direction and are electrically connected to each other through the third metal pattern layer 243. Each of the first and second scan lines 14 and 24, and the emission control line 15 including the dual-layered structure of the first and second metal pattern layers 241 and 242 has a resistance less than that of a single layered metal pattern layer. Thus, the RC delay can be reduced or prevented due to the reduction in the resistance.

Configurations of the data line 16, the driving voltage line 26, the connection line 27, and the first and second cover metals CM1 and CM2 are described above.

Figure 7H:
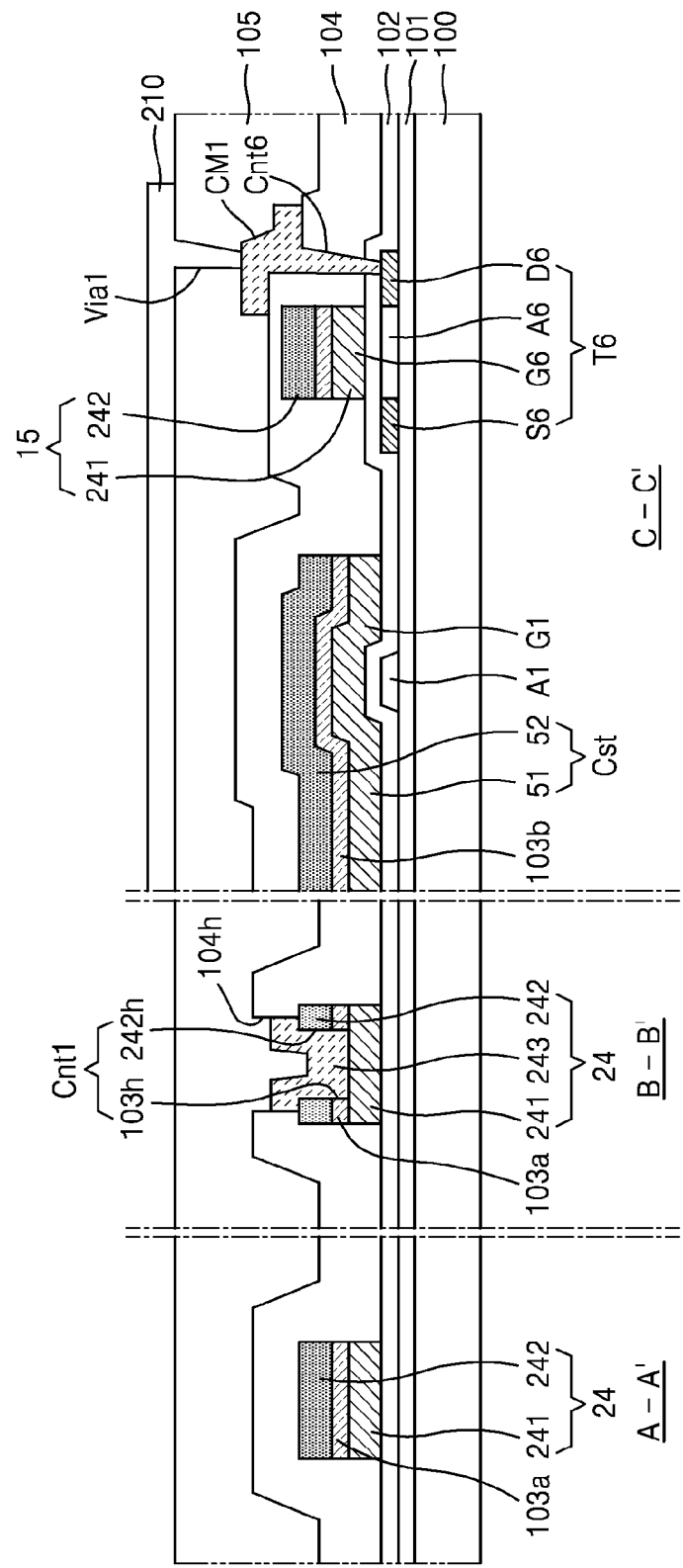

FIG. 7H shows fifth and sixth mask processes.

Referring to FIG. 7H and FIG. 3, the fourth insulating layer 105 is formed and the first and second via holes via1 and via2 penetrating through the fourth insulating layer 105 are formed (the fifth mask process). The first via hole via1 is formed on a location corresponding to the sixth contact hole Cnt6 to expose the first cover metal CM1 and the second via hole via2 is formed on a location corresponding to the seventh contact hole Cnt7 to expose the second cover metal CM2.

After that, the pixel electrode 210 and the initialization voltage line 22 are formed (the seventh mask process).

The pixel electrode 210 is connected to the first cover metal CM1 through the first via hole via1 and is connected to the second emission control TFT T6 via the first cover metal CM1. The initialization voltage line 22 is connected to the second initialization TFT T7 through the second via hole via2.

Next, although not shown in the drawings, a pixel defining layer (not shown) including an opening that exposes an upper surface of the pixel electrode 210 (an eighth mask process) is formed and an intermediate layer including an organic emission layer is formed in the opening defined by the pixel defining layer. An opposite electrode (not shown) covering the pixels 1 is formed on the entire surface of the substrate to form the display device, for example, as an OLED display.

In the present embodiment, the organic emission layer is interposed between the pixel electrode 210 and the opposite electrode, but one or more embodiments are not limited thereto. As another embodiment, a liquid crystal layer can be arranged between the pixel electrode 210 and the opposite electrode to form an LCD.

According to the method of manufacturing the display device described with reference to FIGS. 7A through 7H, the number of masks that are used may be reduced less than that of the method described above with reference to FIGS. 5A through 5G.

Figure 8:
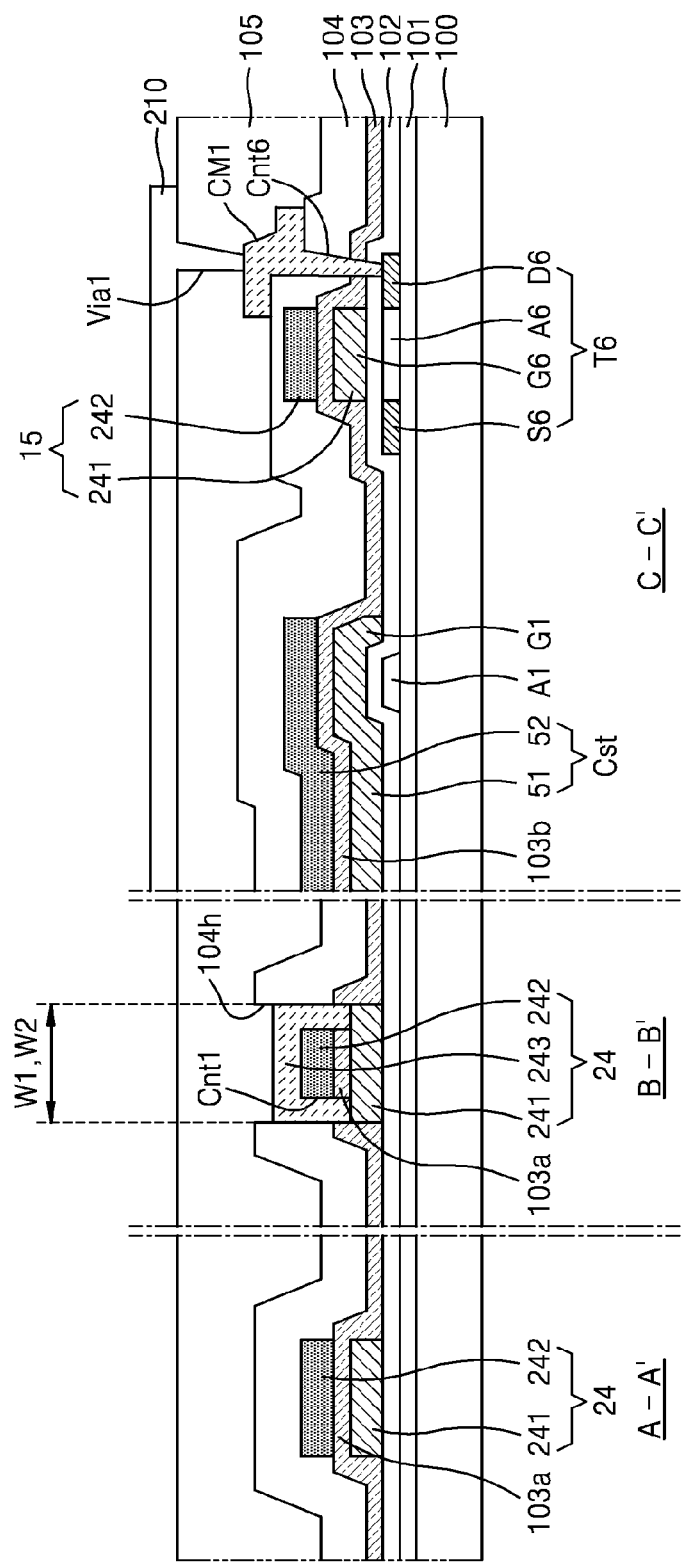
FIGS. 8 and 9 are cross-sectional views of a display device according to another embodiment taken along lines A-A', B-B', and C-C' of FIG. 3.
Figure 9:
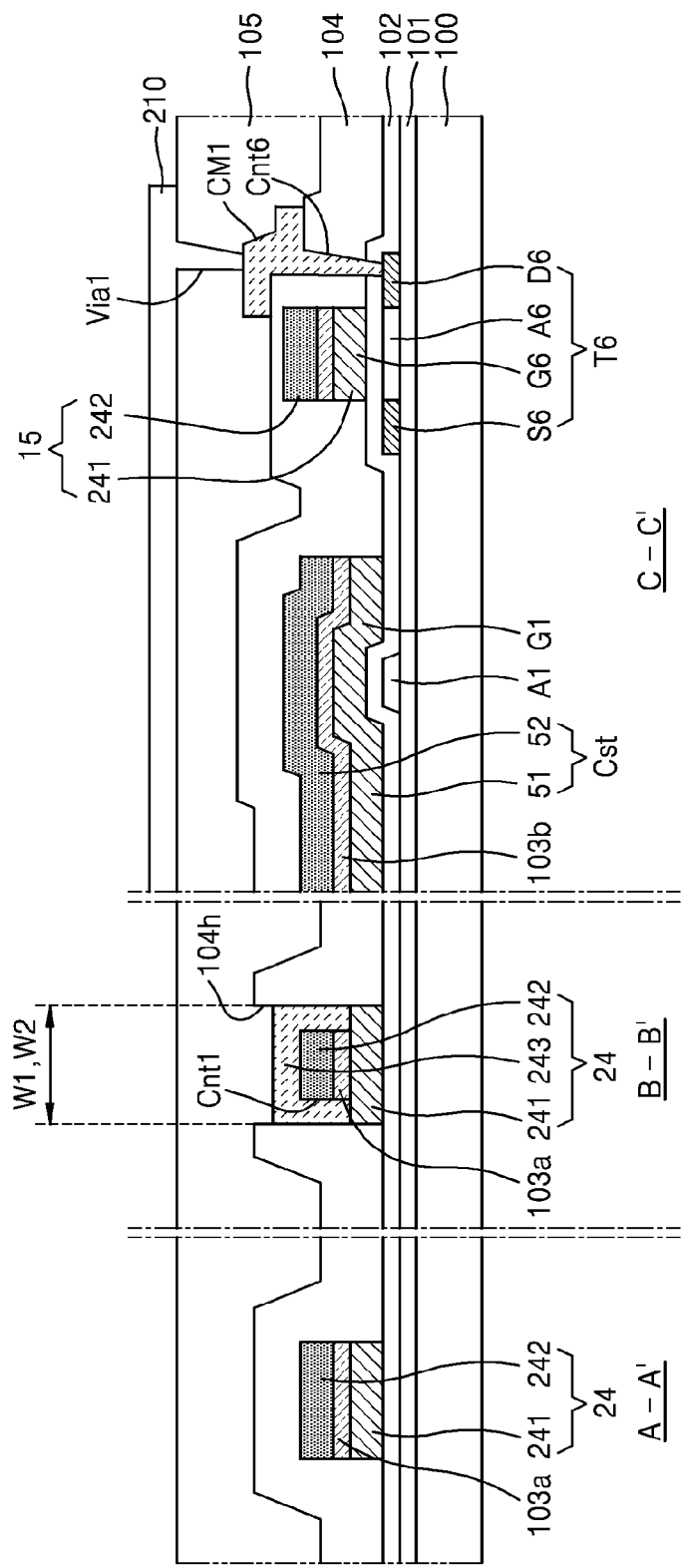

FIGS. 8 and 9 are cross-sectional views of a display device according to another embodiment taken along lines A-A', B-B', and C-C' of FIG. 3.

Referring to FIG. 8, the first contact hole Cnt1 can be formed to have a donut shape. The first contact hole Cnt1 of the display device described above with reference to FIG. 4 exposes a center of the first metal pattern layer 241, whereas the first contact hole Cnt1 of the display device shown in FIG. 8 is formed to have a donut shape so as to expose edges of the upper surface of the first metal pattern layer 241. In this embodiment, the outer diameter W1 of the first contact hole Cnt1 and the inner diameter W2 of the through hole 104h in the first insulating layer 104 can be substantially equal to each other.

The display device shown in FIG. 8 is substantially the same as the display device described with reference to FIG. 4, except for the first contact hole Cnt1. In addition, the display device according to the present embodiment can be manufactured by the substantially the same manufacturing method as that described with reference to FIGS. 5A through 5G, except for the shape of the first contact hole Cnt1.

Referring to FIG. 9, the display device is substantially the same as the display device described with reference to FIG.

8, except that the intermediate insulating layer 103a and the dielectric layer 103b are patterned.

The display device according to the present embodiment shown in FIG. 9 is substantially the same as the display device described with reference to FIG. 6, except that the first contact hole Cnt1 is formed as a donut. In addition, the display device according to the present embodiment can be manufactured by the manufacturing method illustrated with reference to FIGS. 7A and 7H except for the shape of the first contact hole Cnt1.

As described above, according to the one or more of the above exemplary embodiments, the display device and the method of manufacturing the display device according to one or more embodiments can reduce the RC delay of the signal lines.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments of the inventive technology have been described with reference to the figures, it will be understood by those of ordinary skill in the art that various changes in form and details may be made therein without departing from the spirit and scope of the invention as defined by the following claims.

What is claimed is:
1. A display device, comprising:
a first line extending in a first direction;
a second line extending in a second direction; and
a storage capacitor electrically connected to at least one of the first line and the second line,
wherein the first line includes:
a first metal pattern layer extending in the first direction;
an intermediate insulating layer formed over the first metal pattern layer;
a second metal pattern layer formed over the first metal pattern layer and the intermediate insulating layer, the second metal pattern layer extending in the first direction, the second metal pattern layer including a lower surface facing the first metal pattern layer and an upper surface opposite to the lower surface; and
a third metal pattern layer on the upper surface of the second metal pattern layer, a part of the third metal pattern layer extending to the first metal pattern via a contact hole to electrically connect the first metal pattern layer and the second metal pattern layer.
2. The display device of claim 1, wherein the second metal pattern layer has substantially the same pattern as the first metal pattern layer.
3. The display device of claim 2, wherein the intermediate insulating layer has substantially the same pattern as the first and second metal pattern layers.
4. The display device of claim 1, wherein the third metal pattern layer is formed directly on the second metal pattern layer.
5. The display device of claim 1, wherein the third metal pattern layer is formed on the same layer as the second line and is formed of the same material as the second line.
6. The display device of claim 1, wherein the contact hole penetrates through the intermediate insulating layer and the second metal pattern layer.
7. The display device of claim 1, wherein the contact hole exposes an upper surface of the first metal pattern layer.

8. The display device of claim 1, further comprising an insulating layer covering the first line and the storage capacitor, wherein the insulating layer comprises a through hole corresponding to the contact hole.
9. The display device of claim 8, wherein a diameter of the through hole is equal to or greater than a diameter of the contact hole.
10. The display device of claim 8, wherein an upper surface of the first metal pattern layer and the upper surface of the second metal pattern layer are exposed via the through hole.
11. The display device of claim 1, wherein the third metal pattern layer contacts at least a portion of an upper surface of the first metal pattern layer and the upper surface of the second metal pattern layer.
12. The display device of claim 1, wherein the storage capacitor comprises a first electrode, a second electrode formed over the first electrode, and a dielectric layer interposed between the first electrode and the second electrode and wherein the first electrode, the dielectric layer, and the second electrode are respectively formed on the same layers as the first metal pattern layer, the intermediate insulating layer, and the second metal pattern layer and comprise the same materials as that of the first metal pattern layer, the intermediate insulating layer, and the second metal pattern layer.
13. The display device of claim 1, wherein the first line comprises at least one of a scan line and an emission control line and the second line comprises a data line.
14. The display device of claim 1, wherein the third metal pattern layer is an island type layer.
15. A method of manufacturing a display device, the method comprising:
forming a first line extending in a first direction;
forming a second line extending in a second direction; and
forming a storage capacitor comprising a first electrode, a dielectric layer, and a second electrode,
wherein the forming of the first line comprises:
forming a first metal pattern layer extending in the first direction;
forming an intermediate insulating layer over the first metal pattern layer;
forming a second metal pattern layer extending in the first direction over the intermediate insulating layer, the second metal pattern layer including a lower surface facing the first metal pattern layer and an upper surface opposite to the lower surface; and
forming a third metal pattern layer on the upper surface of the second metal pattern layer, wherein a part of the third metal pattern layer connects the first metal pattern layer to the second metal pattern layer via a contact hole.
16. The method of claim 15, wherein the second metal pattern layer has substantially the same pattern as the first metal pattern layer.
17. The method of claim 15, wherein the forming of the third metal pattern layer comprises forming the third metal pattern layer so as to contact a portion of an upper surface of the first metal pattern layer and an upper surface of the second metal pattern layer.
18. The method of claim 15, further comprising forming the contact hole so as to penetrate through the intermediate insulating layer and the second metal pattern layer.
19. The method of claim 15, further comprising:
forming an insulating layer that covers the second metal pattern layer; and forming a through hole that penetrates through the insulating layer and is aligned with the contact hole,
wherein the forming of the insulating layer and the forming of the through hole are performed before the forming of the third metal pattern layer.

20. The method of claim 19, wherein the forming of the second metal pattern layer comprises forming a first hole in the second metal pattern layer, wherein the forming of the through hole comprises forming a second hole in the insulating layer that is aligned with the first hole, the first hole and the second hole forming the contact hole.

21. The method of claim 19, wherein a diameter of the through hole is equal to or greater than a diameter of the contact hole.

22. The method of claim 15, wherein the third metal pattern layer is formed on the same layer as the second line and comprises the same material as that of the second line.

23. The method of claim 15, wherein the first metal pattern layer is formed on the same layer as the first electrode and comprises the same material as that of the first electrode and wherein the second metal pattern layer is formed on the same layer as the second electrode and comprises the same material as that of the second electrode.

24. The method of claim 15, wherein the third metal pattern layer is an island type layer.

25. The method of claim 15, wherein the first line comprises at least one of a scan line and an emission control line and wherein the second line comprises a data line.

26. The method of claim 15, wherein the forming of the first metal pattern layer, the forming of the intermediate insulating layer, and the forming of the second metal pattern layer are performed at the same time in a mask process.

* * * * *